(12) United States Patent
Maekawa et al.

(10) Patent No.: US 7,727,854 B2
(45) Date of Patent: Jun. 1, 2010

(54) MANUFACTURING METHOD OF SEMICONDUCTOR DEVICE

(75) Inventors: Shinji Maekawa, Shizouka (JP); Gen Fujii, Kanagawa (JP); Junya Maruyama, Kanagawa (JP); Toru Takayama, Kanagawa (JP); Yumiko Fukumoto, Kanagawa (JP); Yasuyuki Arai, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 631 days.

(21) Appl. No.: 10/573,155

(22) PCT Filed: Dec. 14, 2004

(86) PCT No.: PCT/JP2004/018971

§ 371 (c)(1),
(2), (4) Date: Mar. 23, 2006

(87) PCT Pub. No.: WO2005/062388

PCT Pub. Date: Jul. 7, 2005

(65) Prior Publication Data

US 2007/0004100 A1 Jan. 4, 2007

(30) Foreign Application Priority Data

Dec. 19, 2003 (JP) ............................. 2003-423061

(51) Int. Cl.
*H01L 21/76* (2006.01)
(52) U.S. Cl. .................. 438/406; 438/455; 438/458
(58) Field of Classification Search .............. 438/406, 438/455, 458
See application file for complete search history.

(56) References Cited

U.S. PATENT DOCUMENTS

| 5,737,248 A | 4/1998 | Kawasaki et al. |
| 5,821,138 A | 10/1998 | Yamazaki et al. |

(Continued)

FOREIGN PATENT DOCUMENTS

CN 1297582 5/2001

(Continued)

OTHER PUBLICATIONS

International Search Report of Application No. PCT/JP2004/018971; PCT7594 Dated: Mar. 22, 2005.

(Continued)

*Primary Examiner*—Thien F Tran
(74) *Attorney, Agent, or Firm*—Nixon Peabody LLP; Jeffrey L. Costellia

(57) ABSTRACT

An IC card is more expensive than a magnetic card, and an electronic tag is also more expensive as a substitute for bar codes. Therefore, the present invention provides an extremely thin integrated circuit that can be mass-produced at low cost unlike a chip of a conventional silicon wafer, and a manufacturing method thereof. One feature of the present invention is that a thin integrated circuit is formed by a formation method that can form a pattern selectively, on a glass substrate, a quartz substrate, a stainless substrate, a substrate made of synthetic resin having flexibility, such as acryl, or the like except for a bulk substrate. Further, another feature of the present invention is that an ID chip in which a thin film integrated circuit and an antenna according to the present invention are mounted is formed.

10 Claims, 15 Drawing Sheets

U.S. PATENT DOCUMENTS

| | | |
|---|---|---|
| 6,372,608 B1 | 4/2002 | Shimoda et al. |
| 6,407,669 B1 | 6/2002 | Brown et al. |
| 6,767,775 B1 | 7/2004 | Yudasaka et al. |
| 7,091,070 B2 | 8/2006 | Imai et al. |
| 7,335,573 B2 | 2/2008 | Takayama et al. |
| 7,436,050 B2 | 10/2008 | Yamazaki et al. |
| 7,612,455 B2 | 11/2009 | Tano et al. |
| 2005/0130389 A1* | 6/2005 | Yamazaki et al. ........... 438/455 |
| 2007/0069210 A1 | 3/2007 | Yamazaki et al. |
| 2007/0120471 A1 | 5/2007 | Yamazaki et al. |
| 2008/0049437 A1 | 2/2008 | Takayama et al. |

FOREIGN PATENT DOCUMENTS

| | | |
|---|---|---|
| CN | 1430192 | 7/2003 |
| EP | 1 085 578 A1 | 3/2001 |
| JP | 11-328341 | 11/1999 |
| JP | 2001-092934 A | 4/2001 |
| JP | 2001-260580 | 9/2001 |
| JP | 2002-230141 | 8/2002 |
| JP | 2002-294197 | 10/2002 |
| JP | 2003-123047 | 4/2003 |
| JP | 2003-318133 A | 11/2003 |

OTHER PUBLICATIONS

Written Opinion (Application No. PCT/JP2004/018971; PCT7594, Dated: Mar. 22, 2005.

Chinese Office Action dated Jun. 20, 2008 in Chinese Application No. 200480037686.6, with English translation.

Chinese Office Action (Application No. 200480037686.6;PCTCN07594) Dated Sep. 11, 2009.

* cited by examiner

MANUFACTURING METHOD OF SEMICONDUCTOR DEVICE

TECHNICAL FIELD

The present invention relates to a chip comprising a paper-like thin film integrated circuit, which has a memory or the like, and merchandises or products to which a label using the chip is attached, and further a method for manufacturing thereof.

BACKGROUND ART

In recent years, one person possesses many cards. The amount of information has been kept increasing since various kinds of information are stored in a card and rewritten as necessary.

The increase in the amount of information is essential in many fields. For example, there are heightened calls for strengthening product safety or management system to the food industry or the manufacturing industry, and thus, product information is increased. However, the current products information is exceedingly little, as information such as a country of manufacture, a maker, a product number which are mainly provided by using bar codes containing figures of over ten columns. Further, when bar codes are used, much time is required due to a manual operation of reading each product.

Considering the above, there is devised a method of managing product using networks. Using this method, the information on products is transferred to stores via a server by inputting identifiers of products with a network terminal in each store (Reference 1: Japanese Patent Laid-Open No. 2002-230141). According to Reference 1, the identifiers of products are shown with two-dimensional bar codes or character strings, and are sent to a server after they are inputted into terminals in stores. The products have a detachable storage medium that holds programs and data on products, or personal information. Cards such as an IC card, a smart card, and a compact flash card are given as examples of the storage medium.

There is proposed a method by which a minute IC chip is installed in valuable securities for preventing misuse thereof, and at the same time, if it returns to a regular manager, the manager can use it again (Reference 2: Japanese Patent Laid-Open No. 2001-260580).

DISCLOSURE OF INVENTION

When the information management is performed by using bar codes, the amount of information that can be provided is limited according with such increase in information. Information management by using bar codes is inefficient since it spends time for reading manually. Further, reading errors due to the manual operation of bar code reading cannot be avoided.

An IC card is more expensive than a magnetic card, and an electronic tag is also more expensive as a substitute for bar codes. As a result, diffusion thereof is prevented, and the IC card and the electronic tag are limited to an application having an important added value.

Concerning Reference 1, there are problems that consumers take a lot of labor to access the Internet and that they must have their own personal computers or the like. Further, in References 1 and 2, unevenness is produced on the surface of merchandise or a product since the integrated circuit including a silicon wafer is thick, in the case where the integrated circuit is mounted in the merchandise or the product, in particular, a paper such as a bill or a label itself attached to the merchandise or the product. Accordingly, the design the merchandise or the product is spoilt.

Therefore, it is an object of the present invention to provide an extremely thin integrated circuit that can be mass-produced at low cost, unlike a conventional silicon wafer, and a manufacturing method thereof.

The invention has been made in view of the object. One feature of the present invention is that an extremely thin integrated circuit (hereinafter, referred to as a thin film integrated circuit) is formed by a formation method that can form a pattern selectively, on a glass substrate, a quartz substrate, a stainless substrate, or as substrate made of synthetic resin having flexibility, e.g., acryl, or the like, except for a bulk substrate. Further, one feature of the present invention is that a chip in which a thin film integrated circuit and an antenna are mounted (hereinafter, referred to as an ID chip or a semiconductor device) is formed.

A droplet discharging method by which a droplet (also referred to as a dot) of a composition in which a material of a conductive film, an insulating film or the like is mixed is selectively discharged (jetted) can be employed as the formation method that can form a pattern selectively. The droplet discharging method is also referred to as an ink-jet printing method depending on its system. Moreover, a printing method can be also given as the formation method that can form a pattern selectively.

As a pattern that is formed selectively like this, electrodes such as a gate electrode, a source electrode, a drain electrode, and a pixel electrode, wirings such as a source wiring and a drain wiring, a semiconductor film and a mask for patterning a semiconductor film and the like are given.

One feature of a ID chip according to the present invention is that the ID chip comprises a thin film transistor having a pattern formed by a droplet discharging method or a printing method, a thin film integrated circuit having the thin film transistor, and an antenna. The thin film integrated circuit is mounted over a substrate to be electrically connected to the antenna.

One feature of a specific ID chip according to the present invention is that the ID chip includes a thin film transistor having a pattern formed by a droplet discharging method or a printing method, a thin film integrated circuit having the thin film transistor, and an antenna. The thin film integrated circuit is mounted on a substrate to be electrically connected to the antenna, and the antenna is provided for an object through the thin film integrated circuit.

One feature of an ID chip according to the present invention is that the ID chip comprises a thin film transistor having a pattern formed by a droplet discharging method or a printing method, a thin film integrated circuit having the thin film transistor, and an antenna. The antenna is provided over a flexible substrate, the thin film integrated circuit is mounted over a substrate to be electrically connected to the antenna, and the substrate is folded to sandwich the thin film integrated circuit therein.

In manufacturing steps of a thin film integrated circuit according to the present invention, all patterns are not necessarily formed by a method that can form a pattern selectively. If a method that can form a pattern selectively is employed in one step in manufacturing a thin film integrated circuit according to the present invention, an advantageous effect of the present invention can be obtained. It is natural that patterns of plural steps may be formed by a method that can form a pattern selectively in manufacturing steps of the thin film integrated circuit.

One feature of a method for manufacturing an ID chip according to the present invention comprises the steps of forming a thin film integrated circuit by a droplet discharging method or a printing method over a first substrate; forming an antenna over a second substrate; and attaching the first substrate to the second substrate so that the thin film integrated circuit is electrically connected to the antenna.

One feature of a method for manufacturing an ID chip according the present invention comprises the steps of forming a thin film integrated circuit by a droplet discharging method or a printing method over a first substrate; forming an antenna over a second substrate having flexibility; and folding the second substrate to sandwich the thin film integrated circuit therein so that the thin film integrated circuit is electrically connected to the antenna.

One feature of a method for manufacturing an ID chip according the present invention comprises the steps of forming a thin film integrated circuit by a droplet discharging method or a printing method over a first substrate; forming an antenna over a second substrate; attaching the first substrate to the second substrate so that the thin film integrated circuit is electrically connected to the antenna; and separating the first substrate from the thin film integrated circuit.

One feature of a method for manufacturing an ID chip according the present invention comprises the steps of forming a thin film integrated circuit by a droplet discharging method or a printing method over a first substrate; attaching a second substrate onto the thin film integrated circuit; separating the first substrate from the thin film integrated circuit; forming an antenna over a third substrate; and attaching the second substrate to the third substrate so that the thin film integrated circuit is electrically connected to the antenna.

One feature of a method for manufacturing an ID chip according the present invention comprises the steps of: forming a thin film integrated circuit by a droplet discharging method or a printing method over a first substrate in at least one step; forming an antenna over the thin film integrated circuit; attaching the first substrate to the second substrate so that the thin film integrated circuit is electrically connected to the antenna; and separating the first substrate from the thin film integrated circuit.

One feature of a method for manufacturing an ID chip according the present invention comprises the step of: forming the antenna by a sputtering method, a droplet discharging method, a printing method, a plating method, a photolithography method, or a vapor deposition method using a metal mask. The antenna is formed, and then pressed by being pressurized to enhance the planarity thereof.

Information exchange or information management can be conducted more easily in a shorter time by using a thin film integrated circuit according to the present invention than by using an information supplying means such as bar codes, and thus, a wide variety of information can be provided. Further, a thin film integrated circuit according to the present invention is extremely thin unlike a conventional silicon wafer, and therefore, the design is not spoilt when it is attached to a product or the like.

The cost of a chip, i.e. an ID chip can be lowered as compared with a chip of a conventional silicon wafer, since the ID chip is formed over a glass substrate or the like. A chip formed by using a silicon wafer has a limitation on a shape of a mother substrate, since it is taken out a circular silicon wafer. On the other hand, an ID chip according to the present invention has no limitations on a shape of a mother substrate, since the mother substrate is an insulating substrate such as a glass. Accordingly, the productivity can be enhanced and mass-production is possible. As a result, further cost reduction can be expected. An integrated circuit having extremely low unit cost such as a chip of the present invention generates enormous profits by reducing the unit cost.

BRIEF DESCRIPTION OF DRAWINGS

In the accompanying drawings.

BEST MODE FOR CARRYING OUT THE INVENTION

Figure 1A:
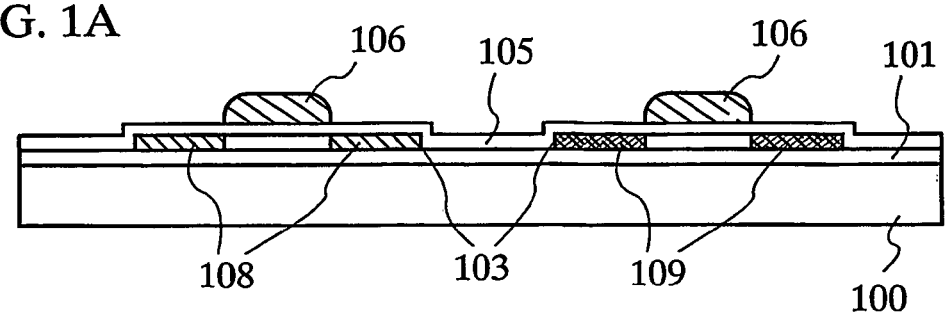
FIGS. 1A to 1D are each a cross-sectional view showing manufacturing steps of a thin film integrated circuit.

Embodiment modes of the present invention are hereinafter described with reference to accompanying drawings. The invention can be implemented in various odes. It is to be understood that various changes and modifications will be apparent to those skilled in the art, unless such changes and modifications depart from the spirit and scope of the present invention hereinafter defined. Therefore, the present invention is not limited to Embodiment Modes.

Note that the same reference numerals are each given to the same portion or a portion having a similar function throughout all figures for explaining embodiment modes, and the description thereof is not repeated to be omitted.

EMBODIMENT MODE 1

Embodiment Mode 1 describes an example of a method of manufacturing a thin film integrated circuit to be mounted in an ID chip.

As shown in FIG. 1A, a substrate 100 having an insulating surface is prepared. For example, a glass substrate such as a barium borosilicate glass or an alumino borosilicate glass, a quartz substrate, a stainless substrate or the like can be used for the substrate 100. In addition, a substrate comprising plastic typified by polyethylene-terephthalate (PET), polyethylene naphthalate (PEN), polyeter sulfone (PES) and a substrate made of synthetic resin having flexibility such as acryl generally tend to have worse heat-resistance than other types of substrates. However, such substrates can be used as long as they can resist a treatment temperature in a manufacturing step.

In order to enhance the planarity of the substrate, the substrate is preferably used after the surface thereof is polished by a chemical or mechanical polishing method, a so-called CMP method (Chemical-Mechanical Polishing). As a polishing material (slurry) of CMP, a polishing material in which fumed silica particles obtained by thermally decomposing silicon chloride gas are dispersed in a KOH added water solution, for example, can be used.

A base film 101 is formed on the substrate 100. The base film is formed in order to prevent an alkaline metal such as Na or an alkaline earth metal contained in the substrate from spreading in a semiconductor film and exerting an adverse influence on semiconductor element characteristics. The base film can be therefore formed by using an insulating film such as silicon oxide, silicon nitride, silicon nitride oxide, titanium oxide, or titanium nitride, which is capable of suppressing the spread of an alkaline metal or an alkaline earth metal into the semiconductor film.

The base film 101 may have a laminated structure. For example, a silicon nitride oxide film of 10 to 200 nm (preferably, 50 to 100 nm) as the first base film and a silicon oxynitride film of 50 to 200 nm (preferably, 100 to 150 nm) as the second base film may be laminated in order. Note that the silicon nitride oxide film can be formed by a plasma CVD method with $SiH_4$, $N_2O$, $NH_3$, and $H_2$ as a material gas, pressure of 0.3 Torr (39.9 Pa), RF power of 50 W, RF frequency of 60 MHz, and a substrate temperature of 400° C. The silicon oxynitride film is formed by a plasma CVD method with $SiH_4$, and $N_2O$ as a material gas, pressure of 0.3 Torr (39.9 Pa), RF power of 150 W, RF frequency of 60 MHz, and a substrate temperature of 400° C.

The base film is not necessarily provided, as long as it is possible to prevent impurities from diffusing into a semiconductor film. Thus, the base film is not necessarily provided when using a quartz substrate or the like, for which impurity diffusion does not cause a problem. It is, however, effective to use a base film in order to prevent impurity diffusion in the case of using a substrate that contains a certain amount of an alkaline metal or an alkaline earth metal, such as a glass substrate, a stainless substrate or a plastic substrate.

An amorphous semiconductor film 102 is formed over the base film 101. The amorphous semiconductor film is 25 to 100 nm (preferably, 30 to 60 nm) thick. Silicon germanium as well as silicon can be used for the amorphous semiconductor film. In the case of using silicon germanium, the concentration of germanium is preferably about 0.01 to 4.5 atomic %. In addition, a semiconductor film mainly containing silicon is used to form an amorphous semiconductor film (also, referred to as an amorphous silicon film) in this embodiment mode.

The amorphous semiconductor film is heat-treated to be crystallized. For the heat-treatment, a heating furnace, laser irradiation or irradiation of light emitted from a lamp (hereinafter, referred to as lamp annealing) instead of laser light or a combination thereof can be used.

In the case of using a heating furnace, the amorphous semiconductor film 102 may be heat-treated for 2 to 20 hours at temperatures 500 to 550° C. At this time, it is preferable that the temperature is set in multiple-step within the range of 500 to 550° C. in such a way that the heating temperature becomes higher gradually. Dehydrogenation, which can reduce film unevenness in crystallization, can be conducted, since hydrogen and the like come out of the amorphous semiconductor film by the initial heat treatment at low temperature. Further, it is preferable that a metal element for promoting crystallization, e.g., nickel, is formed on the amorphous semiconductor film, thereby reducing the heating temperature.

However, there is a concern that a metal element adversely affects electric characteristics of a semiconductor element in the case of forming the metal element, and thus, it is necessary that a gettering step is conducted to reduce or remove the metal element. For example, a gettering step of the metal element may be conducted by using the amorphous semiconductor film as a gettering sink.

In the case of laser light irradiation, a continuous wave type laser (CW laser) and a pulsed oscillation type laser (pulsed laser) can be used. One or a plurality of lasers of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser and a gold vapor laser can be used as the laser. It is preferable that a shape of a laser beam is linear and the length of a longitudinal axis is 200 to 350 μm. Further, the laser beam may have an incident angle θ (0°<θ<90°) to a semiconductor film.

The laser crystallization may be conducted by emitting laser light of a fundamental wave of a continuous wave laser and laser light of a harmonic of a continuous wave laser, or emitting laser light of a fundamental wave of a continuous wave laser and laser light of a harmonic of a pulsed laser.

Laser-irradiation may be conducted in an atmosphere of an inert gas such as a rare gas or nitrogen. As a result, unevenness of a semiconductor surface due to laser light irradiation can be suppressed, and further, fluctuation of a threshold value due to the variations of interface state density can be suppressed.

A crystalline semiconductor film may be formed directly on a surface. In this case, a fluorine-based gas such as $GeF_4$ or $F_2$ and a silane-based gas such as $SiH_4$ or $Si_2H_6$ are used to form a crystalline semiconductor film directly on a surface by heat or plasma.

The thusly formed crystalline semiconductor film is patterned into a desired shape to obtain an island-like semiconductor film 103. For patterning, a predetermined mask is formed by a photolithography method or a droplet discharging method. It is preferable that a droplet discharging method is employed to form a mask since efficiency in the use of materials improves, and a cost and the amount of waste liquid can be reduced. In particular, process can be more simplified in the case of forming a mask by a droplet discharging method than the case of a photolithography step. In other words, formation of a photomask, light-exposure and the like are not required, and thus, reduction of costs such as a facility investment cost can be achieved, and manufacturing time can be shortened.

At this time, the composition is discharged to be a dot shape (droplet) or a pillar shape by a series of dots; however, they are collectively referred to as a dot (droplet). Discharging a dot (droplet) means that a dot-like droplet or a pillar-like droplet is discharged. In other words, since a plurality of dots are discharged continuously, a pillar-like (dot) droplet is discharged in some cases without being recognized as a dot.

As the mask material, an inorganic material (such as silicon oxide, silicon nitride, silicon oxynitride), or a photosensitive or non-photosensitive organic material (such as polyimide, acryl, polyamide, polyimide amide, polyvinyl alcohol, benzocyclobutene or resist) can be used. For example, when a mask is formed from polyimide by a droplet discharging method, polyimide may be discharged at a desired portion by a droplet discharging method and then may be heat-treated at 150° C. to 300° C. to be baked.

The crystalline semiconductor film is patterned by dry-etching or wet-etching using a mask. A plasma treatment is performed to remove the mask after pattering. Note that the mask may serve as an insulating film without being removed.

An insulating film, a so-called gate insulating film 105, is formed to cover the island-like semiconductor film. The gate insulating film is formed of an insulating film containing silicon to be 10 to 150 nm thick, preferably 20 to 40 nm thick by a plasma CVD method, a low pressure CVD method or a sputtering method. It is natural that the gate insulating film is not limited to a silicon oxynitride film, and may be a single layer or laminated layer of other insulating films containing silicon.

After that, a conductive film, that is, a gate electrode 106, is formed over the crystalline semiconductor film with the gate insulating film therebetween. The gate electrode can be formed by a droplet discharging method, a CVD method or a sputtering method. The gate electrode may comprise an element selected from Ta, W, Ti, Mo, Al and Cu, or an alloy material or a compound material containing the element mainly. It is natural that the gate electrode may have a single layer structure or a laminated structure. For example, it is possible that a tantalum nitride film of 10 to 50 nm thick as a first conductive film 108a and a tungsten film of 200 to 400 thick nm as a second conductive film 108b are laminated sequentially to form the gate electrode.

In the case of forming the gate electrode by a droplet discharging method, gold (Au), silver (Ag), copper (Cu), platinum (Pt), palladium (Pd), tungsten (W), nickel (Ni), tantalum (Ta), bismuth (Bi), lead (Pb), indium (in), tin (Sn), zinc (Zn), titanium (Ti), or aluminum (Al) can be employed as a conductor, and a material in which a plurality of these conductors are mixed can be used. Further, an alloy of the conductors, dispersive nanoparticles thereof, or silver halide particles can be used. In the invention, a compound obtained by dispersing metal fine particles into organic solvent is used for forming a conductive layer such as the gate electrode. The metal fine particles having an average particle diameter of 1 to 50 nm, preferably 3 to 7 nm are used. The organic solvent is phenol resin, epoxy resin and the like and a heat curing or light curing resin is applied. Viscosity of this compound may be controlled by adding thixotropic agent or diluent.

It is preferable to coat the surfaces of conductor particles with an organic material or with a conductor in order to disperse a material of the conductor or the like efficiently. The material coating the surfaces may have a laminated structure. The material for coating the surfaces may preferably be conductive. Even if a coating material is insulative, it may be removed by a heat treatment or the like. For example, surfaces of silver or gold are covered with dispersant such as amine, alcohol, and thiol. In particular, in the case of using copper, the surface of the copper particle may be coated with a material such as nickel (Ni) or nickel boron (NiB), thereby preventing copper from spreading in a semiconductor film or the like.

In this embodiment mode, the gate electrode is formed from a conductor of Ag by a droplet discharging method.

In the case where the solvent in the droplets are required to be removed, a heat treatment is carried out for baking or drying, specifically at a predetermined temperature of 200° C. to 300° C. It is preferable to carry out the heat treatment in an oxygen containing atmosphere. In this case, the heating temperature is set so as not to generate unevenness on a surface of the gate electrode. In particular, when droplets containing silver (Ag) are used as in this embodiment mode, a heat treatment is preferably carried out in an atmosphere containing oxygen and nitrogen. For example, the composition ratio of oxygen is set to be 10% to 25%. An organic material such as a thermosetting resin of an adhesive agent or the like contained in a solvent of the droplets is decomposed; thus, silver (Ag) which does not contain an organic material can be obtained. Consequently, the planarity of the gate electrode surface can be improved and specific resistance value can be lowered. Note that, the gate electrode formed like this includes fine particles having average particle diameter 1 to 50 nm, more preferably 3 to 7 nm.

In the case of forming the gate electrode by a droplet discharging method as described above, a material of the gate insulating film may be a material having a favorable adhesiveness with a material of the gate electrode. For example, it is preferable that a gate insulating film comprising titanium oxide (TiOx) is formed in the case of using Ag for the gate electrode. In other words, titanium oxide (TiOx) has functions of serving as a gate insulating film and enhancing the adhesiveness.

The organic solvent including metal fine particles is ejected by the droplet discharging method and is cured by heat treatment or light irradiation. The metal fine particles contact with each other by volume-shrinkage due to the curing of organic solvent, thereby welding and fusing, or agglomeration is promoted, and a conductive layer is formed. The conductive layer formed by sputtering method includes a columnar structure, while the conductive layer formed by the droplet discharging method includes a polycrystalline having a plurality of grain boundaries.

Then, an impurity region 108 is formed in a self-alignment manner by adding phosphorous (P), which is an impurity element, into a region to be an n-channel TFT by using the gate electrode 106 as a mask. In some cases, the impurity region is formed to be overlapped with the gate electrode, since an impurity element intrudes under the gate electrode in adding the impurity element. An impurity region overlapped with the gate electrode can be formed by making the sideface of the gate electrode tapered.

After that, an impurity region 109 is formed in a self-alignment manner by adding boron (B), which is an impurity element, into a region to be a p-channel TFT by using the gate electrode 106 as a mask in a state that the region to be an n-channel TFT is covered with a resist mask.

The thusly formed thin film transistor, in which the gate electrode is provided above the semiconductor film, is a so-called top gate type thin film transistor. A substrate where such plural thin film transistors are formed can be referred to as a TFT substrate.

Figure 1B:
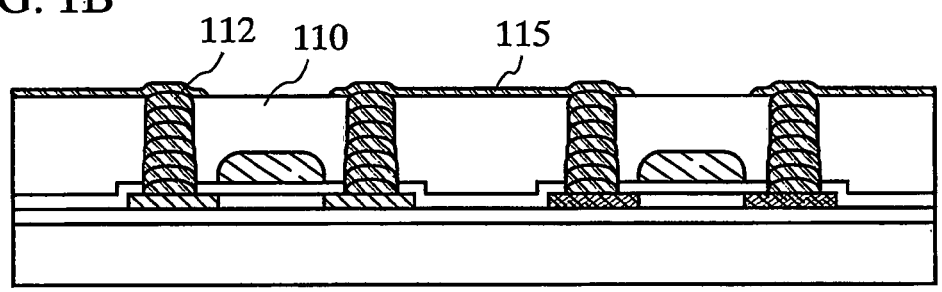

As shown in FIG. 1B, an insulating film 110 and a wiring 112 connected to each impurity region are formed. The insulating film can be formed of an organic material or an inorganic material. As the organic material, polyimide, acryl, polyamide, polyimide amide, benzocyclobutene, resist, siloxane, or polysilazane can be used. Siloxane is formed by using a polymeric material as a starting material, which has a skeleton formed by the bond of silicon (Si) and oxygen (O), and which includes at least hydrogen as a substituent, or at least one of fluoride, alkyl group, and aromatic hydrocarbon as the substituent. Polysilazane is formed by using a liquid material including a polymeric material having a bond of silicon (Si) and nitrogen (Ni) as a start material. As the inorganic material, silicon oxide or silicon nitride can be used. The insulating film can be formed by a plasma CVD method, a low pressure CVD method, a droplet discharging method, a spin-coating method or a dipping method. In the case of using a material having high viscosity, a droplet discharging method, a spin-coating method or a dipping method is preferably employed.

The wiring can be formed by a sputtering method, a CVD method or a droplet discharging method. As a material of the wiring, a film made of an element selected from aluminum (Al), titanium (Ti), molybdenum (Mo), tungsten (W) and silicon (Si) or an alloy film containing the elements may be used. In the case of forming the wiring by a droplet discharging method, gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), or aluminum (Al) is employed as a conductor mixed in a solvent. Further, an alloy of the conductors, dispersive nanoparticles thereof, or silver halide particles can be used.

The organic solvent including metal fine particles is ejected by the droplet discharging method and is cured by heat treatment or light irradiation. The metal fine particles contact with each other by volume shrinkage due to the curing of organic solvent, thereby welding and fusing, or agglomeration is promoted, and a conductive layer is formed. The conductive layer formed by sputtering method includes a columnar structure, while the conductive layer formed by the droplet discharging method includes a polycrystalline having a plurality of grain boundaries. Note that, the wiring formed like this includes fine particles having average particle diameter 1 to 50 nm, more preferably 3 to 7 nm.

In this embodiment mode, the interlayer insulating film and the wiring are formed by a droplet discharging method. At this time, a solvent containing a material of the interlayer insulating film and a solvent containing a material of the conductive film may be discharged simultaneously or a solvent containing a material of the interlayer insulating film may be discharged first and then, a solvent containing a material of the conductive film may be discharged.

In FIG. 1B, a wiring layer is one layer, but a multilayer may be employed. Miniaturization of a thin film integrated circuit can be achieved by employing a multilayer wiring.

After that, a conductive film 115 for connecting the wiring 112 is formed. A material or a manufacturing method of the conductive film 115 may be referred to those of the wiring 112.

Figure 1C:
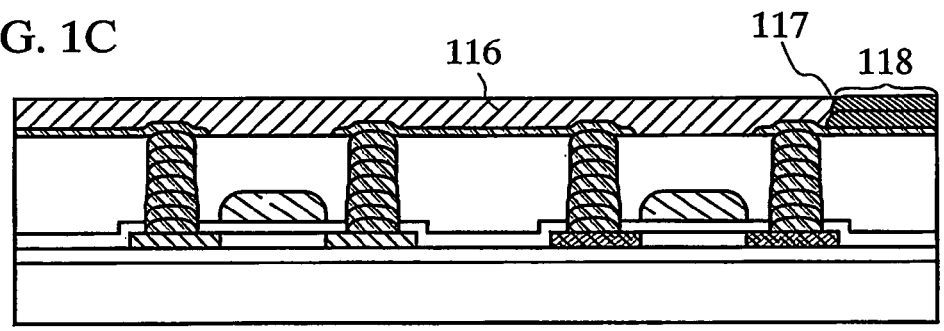

As shown in FIG. 1C, an insulating film 116 serving as a protective film is formed to cover the conductive film 115. A material or a manufacturing method of the insulating film 116 may be referred to those of the interlayer insulating film 110.

A contact hole for connecting the conductive film 115 and a terminal such as an antenna is formed in the insulating film 116, and a conductive film 117 is formed in the contact hole to form a connection terminal portion 118.

Figure 2:
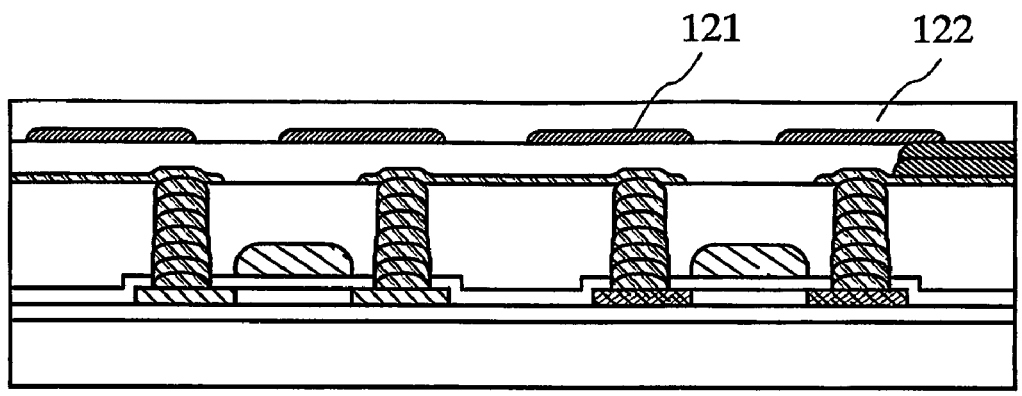
FIG. 2 is a cross-sectional view showing a manufacturing step of a thin film integrated circuit.

As shown in FIG. 2, an antenna 121 may be formed integrally. In this case, a connection terminal portion is formed, and then, the antenna 121 is formed. A portion of the antenna is made to be connected to the connection terminal portion. Thereafter, an insulating film 122 serving as a protective film is formed. A material or a manufacturing method of the insulating film 122 may be referred to those of the interlayer insulating film 110.

The antenna is formed integrally as described above, thereby reducing manufacturing cost of an ID chip mounting the antenna therein. An integrated circuit formed at extremely low unit cost such as an ID chip generates enormous profits by reducing the unit cost.

In FIG. 2, the antenna is formed over the thin film integrated circuit, but the antenna may be formed in the periphery of the thin film integrated circuit. In this case, a step of forming the insulating film 122 can be eliminated, thereby eliminating the thickness of the insulating film.

The antenna can be formed from the same conductive film as the gate electrode, the wiring 112 or the conductive film 115. In this case, the manufacturing step can be eliminated, which is preferable. In particular, when the antenna is formed by a droplet discharging method or a printing method, the gate electrode, the wiring 112 or the conductive film 115 to be formed in the same layer are also preferably formed by a droplet discharging method or a printing method.

Figure 1D:
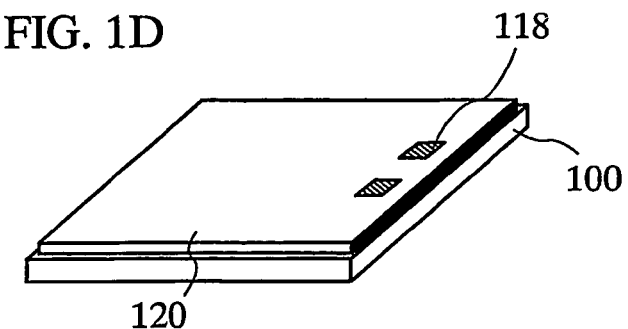

FIG. 1D is an entire view of a thin film integrated circuit formed in this way. The connection terminal portion 118 is provided in a predetermined region of a thin film integrated circuit 120 formed over the substrate 100.

A wide variety of information can be provided by an ID chip mounting extremely thin film integrated circuit therein. Information exchange or information management can be conducted more easily in a shorter time by using an ID chip. Further, the design is not spoilt when an ID chip as well as a label is attached to a product container or the like, since the ID chip is extremely thin.

The thin film integrated circuit according to the present invention does not need a back-grinding process, different from an integrated circuit formed by using a silicon wafer. The back-grinding process results in a crack or a grinding mark. As for the thin film integrated circuit according to the present invention, unevenness of the thickness depends on unevenness of each film in forming a film such as a semiconductor film, and thus, at most several hundred nm of unevenness can be seen. The unevenness can be suppressed dramatically, as compared with the unevenness of several to several tens μm due to the back-grinding process.

An ID chip of the present invention can be manufactured at a lower cost as compared with a chip made by using a silicon wafer, since the ID chip is formed on a low-priced mother substrate such as a glass substrate. A chip formed by using a silicon wafer has a limitation on a shape of a mother substrate, since it is taken out of a circular silicon wafer. On the other hand, an ID chip according to the present invention has no limitations on a shape of a mother substrate, since its mother substrate is an insulating substrate such as glass. Accordingly, the productivity can be enhanced and a size of a shape of an ID chip can be set freely.

As for a material for forming an ID chip, a low cost and safe material is used as compared with a chip formed by using a silicon wafer. Thus, the need to collect used ID chips is little and the ID chips are eco-friendly. It is possible to prevent misuse of an ID chip since it can be cut with a pair of scissors or the like because of an area large enough to be cut when an ID chip is abandoned.

As for an IC chip comprising a silicon wafer, wave-absorbing by the silicon wafer is concerned and there is a case that sensitivity of a signal is a problem. Specifically, wave-absorbing of electric waves of 13.56 MHz or 2.45 GHz, which is frequency used, is concerned. On the other hand, an ID chip of the present invention employs an insulating substrate such as a glass, and thus, wave-absorbing is not caused, which is preferable. Consequently, a high-sensitive ID chip can be formed. Thus, the area of an antenna of the ID chip of the present invention can be reduced, and thus the miniaturization of an ID chip can be expected.

As for a chip formed over a silicon wafer, the silicon wafer is semi-conductive, a junction becomes easily a forward bias to an alternate current, and thus it is necessary to conduct a latch up measurement. On the other hand, there are no such concerns for an ID chip according to the present invention, since a thin film integrated circuit is formed over a substrate having an insulating property.

EMBODIMENT MODE 2

Embodiment Mode 2 describes a method for manufacturing a thin film integrated circuit provided with a thin film transistor having a non-crystalline semiconductor film, unlike the above described embodiment mode.

Figure 3A:
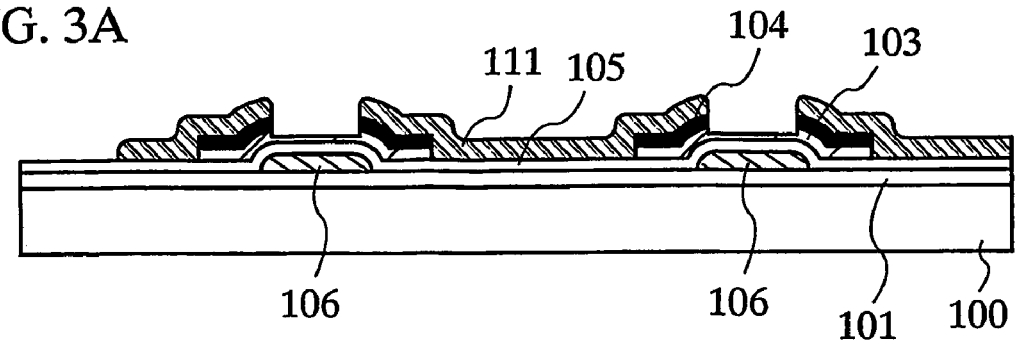
FIGS. 3A to 3D are each a cross-sectional view showing manufacturing steps of a thin film integrated circuit.

As in the above described embodiment mode, a substrate having insulating surface 100 is prepared as shown in FIG. 3A. A material of the substrate having insulating surface can be referred to the above described embodiment mode. In this embodiment mode, a heat treatment for crystallizing is not required since the semiconductor film is non-crystalline. Consequently, a substrate of synthetic resin having flexibility is easy to be employed.

As in the above embodiment, a surface polishing may be conducted on the substrate having insulating surface so as to enhance its planarity.

After that, a base film 101 is formed. A manufacturing method or a material of the base film may be referred to the above described embodiment mode. A conductive film such as titanium can be used for the base film. In this case, the conductive film is at least surface-oxidized by a heat treatment or the like in the manufacturing steps. In addition, 3d transition elements (Sc, Ti, V, Cr, Mn, Fe, Co, Ni, Cu, Zn) and an oxide, a nitride, an oxynitride thereof can be used as another material of the base film.

As described in Embodiment Mode 1, the base film is not necessarily provided, as long as it is possible to prevent impurity diffusion into a semiconductor film.

Then, a gate electrode 106 is formed on the base film. A manufacturing method or a material of the gate electrode can be referred to the above described embodiment mode. In this embodiment mode, the gate electrode is formed of a conductor of Ag or the like by a droplet discharging method.

After that, a heat treatment for baking or drying is conducted when a solvent of the droplet is required to remove. A heating condition can be referred to the above described embodiment mode. The organic solvent including metal fine particles is ejected by the droplet discharging method and is cured by heat treatment or light irradiation. The metal fine particles contact with each other by volume shrinkage due to the curing of organic solvent, thereby welding and fusing, or agglomeration is promoted, and a conductive layer is formed. The conductive layer formed by sputtering method includes a columnar structure, while the conductive layer formed by the droplet discharging method includes a polycrystalline having a plurality of grain boundaries. Note that, the wiring formed like this includes fine particles having average particle diameter 1 to 50 nm, more preferably 3 to 7 nm.

When the gate electrode is formed by a droplet discharging method in this way, a material of the base film may employ a material having favorable adhesiveness with the gate electrode. For example, a base film made of titanium oxide (TiOx) is preferably formed in the case of using Ag as the gate electrode. In other words, titanium oxide LOx) has functions of serving as a base film and enhancing the adhesiveness.

After that, an insulating film serving as a protective film may be formed over the gate electrode. Specifically, an insulating film containing silicon nitride may be formed over the gate electrode formed of Ag by a droplet discharging method. Consequently, it is possible that oxidation of the gate electrode is prevented, and the planarity of the surface can be improved. On the other hand, there is a risk that the surface of the gate electrode becomes uneven, since silver oxide is formed by a reaction with silver (Ag), in the case of using an insulating film including oxygen.

A gate insulating film 105 is formed to cover the gate electrode. A manufacturing method or a material of the gate insulating film may be referred to the above described embodiment mode. In addition to the above described embodiment mode, a material of the gate insulating film can employ an insulator made of an organic material such as polysilazane, or polyvinyl alcohol. The gate insulating film can be formed by a droplet discharging method, a spin-coating method or a dipping method. In the case of using a material having high viscosity, a droplet discharging method, a spin-coating method or a dipping method is preferably employed.

A semiconductor film is formed over the gate insulating film. The semiconductor film can be formed by a plasma CVD method, a sputtering method, a droplet discharging method or the like. In this embodiment mode, the semiconductor film may have any non-crystalline state selected from an amorphous semiconductor, a semi-amorphous semiconductor in which an amorphous state and a crystalline state are mixed (also referred to as a SAS), a micro crystal semiconductor in which crystal grains of 0.5 nm to 20 nm can be seen in an amorphous semiconductor, and a crystalline semiconductor. Note that a state of a micro crystal in which crystal grains of 0.5 nm to 20 nm can be seen is referred to as a micro crystal (μc).

SAS has an intermediate structure between an amorphous structure and a crystalline structure (including a single crystalline structure, and a polycrystalline structure), and a third state that is stable with respect to free energy. SAS includes a crystalline region having short range order and lattice distortion. Crystal grains of 0.5 nm to 20.0 nm in size are contained in at least a part of the film, and in the case where silicon is a main component, in the Raman spectrum, shifts to the lower side of a wave number of 520 cm$^{-1}$, and a diffraction peak of (111) and (220) derived from a silicon crystal lattice is observed in x-ray diffraction. Further, the SAS contains hydrogen or halogen of 1 atom % or more for terminating a dangling bond.

SAS can be obtained by grow discharge decomposition of a silicide gas. As a typical silicide gas, SiH$_4$ is cited, besides, Si$_2$H$_6$, SiH$_2$Cl$_2$, SiHCl$_3$, SiCl$_4$, SiF$_4$ and the like can be used. SAS can be formed easily by a silicide gas diluted with hydrogen, or hydrogen and one or more rare gas elements selected from helium, argon, krypton, and neon. The silicide gas is preferably diluted so that the dilution rate is in the range of 10 times to 1000 times. SAS can be also formed by a method of diluting Si$_2$H$_6$ and GeF$_4$ with a helium gas. The reactive formation of a film by grow discharge decomposition is preferably conducted under low pressure, and the pressure may be about 0.1 Pa to 133 Pa. The power for grow discharge may be 1 MHz to 120 MHz, preferably, a high frequency power of 13 MHz to 60 MHz. The substrate heating temperature is preferably 300° C. or less, and more preferably, substrate heating temperature of 100° C. to 250° C. is recommended.

In this embodiment mode, a SAS containing silicon as the main component is formed by a plasma CVD method as the semiconductor film. When a thin film transistor is formed by using a SAS, the mobility of 1 to 10 cm$^2$/Vsec is obtained.

Next, a semiconductor film having one conductivity type is formed. It is preferable to provide the semiconductor film having one conductivity type since the contact resistance between the semiconductor film and the electrode is reduced, but the semiconductor film may be formed as necessary. The semiconductor film having one conductivity type may be formed by a plasma CVD method, a sputtering method, a droplet discharging method, or the like.

In the case of employing a plasma CVD method, the semiconductor film, the semiconductor film having n-type conductivity, and the gate insulating film can be formed consecutively. Specifically, the films can be formed consecutively without being exposed to the atmosphere by changing the supply of the material gas into a treatment chamber in a plasma CVD apparatus. Consequently, each surface of the semiconductor film, the semiconductor film having n-type conductivity, and the gate insulating film can be protected from impurities.

After that, the semiconductor film and the semiconductor film having n-type conductivity are patterned into a desired shape to obtain an island-like semiconductor film 103 and an island-like semiconductor film having n-type conductivity 104. Patterning may be referred to as the above described embodiment mode.

Since the semiconductor film and the semiconductor film having n-type conductivity are patterned simultaneously, edge portions of the island-like semiconductor film 103 and the island-like semiconductor film having n-type conductivity 104 are aligned. In other words, edge portions of the island-like semiconductor film 103 and the island-like semiconductor film having n-type conductivity 104 do not protrude from the edge portion of each other.

As shown in FIG. 3A, a conductive film serving as a source and drain electrode 111 is formed. The conductive film may have any one of a single layer structure and a laminated structure. In addition, a manufacturing method or a material of the conductive film may be referred to the above described embodiment mode. As in the above described embodiment mode, the conductive film can be formed by a sputtering method, or a plasma CVD method, and may employ a semiconductor film typified by a polycrystalline silicon film into which an impurity element such as phosphorus is doped or an AgPdCu alloy.

Further, in the case of a droplet discharging method, a liquid-repellent treatment may be carried out to improve the liquid repellency of the surface for forming the source and drain electrode. For example, a fluorine-based silane coupling agent or the like may be applied as the liquid-repellent treatment. As another example of the liquid-repellent treatment, a plasma treatment using a mixed gas of $CHF_3$ and $O_2$, or the like may be performed. A heat treatment for baking or drying is conducted when a solvent of the droplet is required to remove.

After that, the semiconductor film having n-type conductivity 104 is etched by using the source electrode and the drain electrode 111 as a mask. This is because the semiconductor film having n-type conductivity prevents the source electrode and the drain electrode from being short-circuited. At the time, the semiconductor film 103 can be also etched to some extent in some cases.

After that, an insulating film serving as a protective film may be formed over the source and drain electrode. Specifically, an insulating film containing silicon nitride may be formed over the source and drain electrode formed of Ag by a droplet discharging method. Consequently, it is possible that oxidation of the source and drain electrode is prevented, and the planarity of the surface can be improved. On the other hand, there is a risk that the surface of the source and drain electrode becomes uneven, since silver oxide is formed by a reaction with silver (Ag), in the case of using an insulating film including oxygen.

As described above, a thin film transistor in which up to the source electrode and the drain electrode have been provided is formed. The thin film transistor in this embodiment mode is a so-called bottom gate type thin film transistor, in which a gate electrode is formed below a semiconductor film. More in detail, it is a so-called channel etch type, in which a semiconductor film is etched to some extent. A substrate where such plural thin film transistors are formed is referred to as a TFT substrate.

Figure 3B:
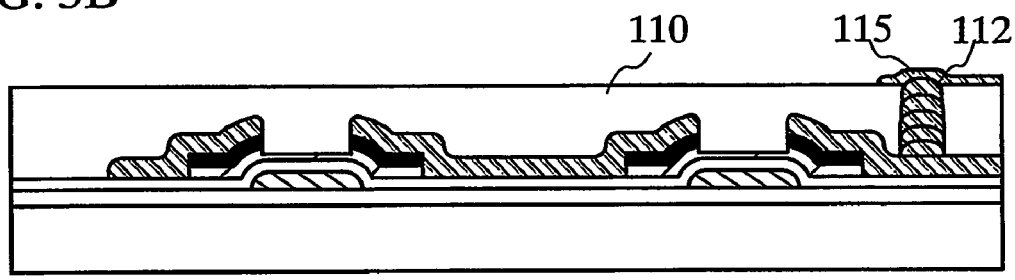

As shown in FIG. 3B, an insulating film 110 and a wiring 112 are formed. A manufacturing method or a material of the insulating film and the wiring can be referred to the above described embodiment mode. Specifically, a droplet having an insulating material and a droplet having a conductive material are discharged simultaneously from nozzles. At this time, two heads are prepared, and nozzles of one head can be only for an insulating material and nozzles of the other head can be only for a conductive material to form them simultaneously. Alternatively, the insulating film and the conducting layer may be formed separately. In this case, either the insulating film or the conductive film may be formed first. However, when the insulating film is preferably formed first, it is expected to prevent a pattern of the conductive film from being collapsed, as compared with a case where a minute conductive film is formed first.

Figure 3C:
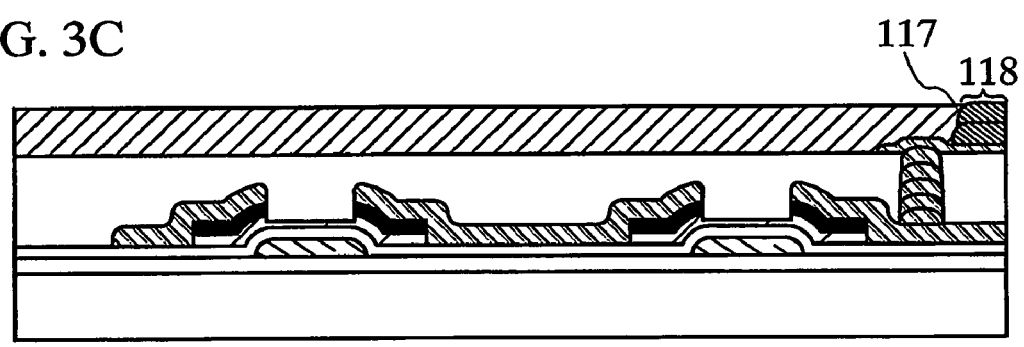

As shown in FIG. 3C, an insulating film 116 serving as a protective film is formed to cover the conductive film 115. A manufacturing method or a material of the insulating film 116 can be referred to the above described embodiment mode.

In this embodiment mode, an antenna 121 may be integrally formed as shown in FIG. 2.

Figure 4:
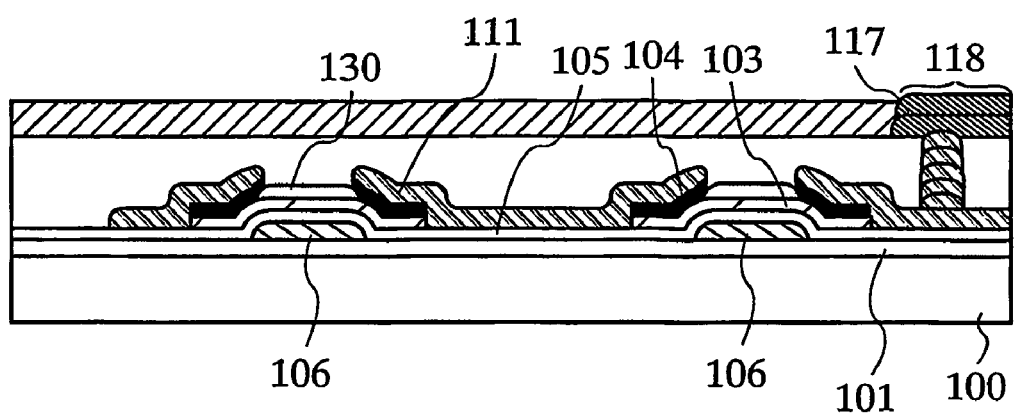
FIG. 4 is a cross-sectional view showing a manufacturing step of a thin film integrated circuit.

A thin film integrated circuit formed by using a channel etch type thin film transistor is described above, but as shown in FIG. 4, a thin film integrated circuit may be formed by using a so-called channel protective type thin film transistor, in which a protective film 130 is formed over the semiconductor film, instead of the channel etch type thin film transistor.

Figure 3D:
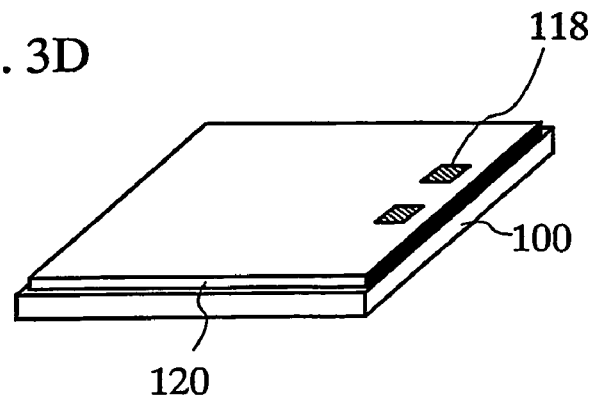

FIG. 3D shows an entire view of a thin film integrated circuit formed in this way. An ID chip has a thin film integrated circuit 120 formed over a substrate 100, and a connection terminal portion 118 is provided in a predetermined region of the thin film integrated circuit.

In such a thin film integrated circuit using a non-crystalline semiconductor film, it is preferable to communicate by an electric wave having low frequency e.g., 13.56 MHz. In addition, it is suitable for a Proximity type that the distance for communication is shorter than 10 cm or a Close-Coupling type that it is about several cm.

In this embodiment mode, a bottom gate type thin film transistor is formed, and thus a thin film integrated circuit can be extremely thin. Therefore, the design is not spoilt, and thus, it is preferable that the thin film integrated circuit is installed as an ID chip in a paper such as a bill.

There is a concern that an area is large, as compared with a crystalline thin film integrated circuit, since a non-crystalline semiconductor film is used. However, it has an advantageous effect that it is possible to prevent misuse of an ID chip since it can be cut with a pair of scissors or the like because of the area large enough to be cut when an ID chip is abandoned.

A chip comprising a conventional silicon wafer is weak in stress. Specifically, a thin film integrated circuit using a non-crystalline semiconductor film tends to be large in its area, and thus, there is a concern about stress cracking. However, an ID chip is strong in stress cracking, namely, in bending stress because of using a highly flexible substrate, since the ID chip has a large area to some extent as compared with a chip of a silicon wafer.

The thin film transistor shown in this embodiment mode has one feature that a conductive film, a mask or the like is formed by at least a droplet discharging method. Thus, efficiency in the use of materials improves, and a cost and an amount of waste liquid can be reduced. In particular, process can be more simplified in the case of forming a mask by an ink-jetting method than the case of a photolithography step. Consequently, reduction of costs such as a facility investment cost or a manufacturing cost of an ID chip can be achieved, and manufacturing time can be shortened.

EMBODIMENT MODE 3

A thin film integrated circuit manufactured by a method different from that of the embodiment mode described above is described in Embodiment Mode 3. This embodiment mode describes the thin film transistor shown in Embodiment Mode 1, but the thin film transistor shown in Embodiment Mode 2 may be also used.

Figure 5A:
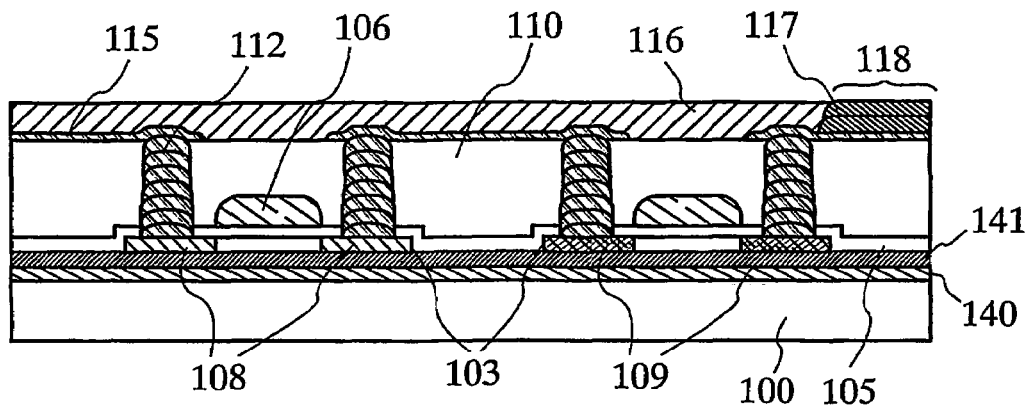
FIGS. 5A to 5C are a cross-sectional view and perspective views showing manufacturing steps of a thin film integrated circuit.

As shown in FIG. 5A, a metal film 140 is formed over a substrate 100. The metal film can be formed of a single layer of an element selected from W, Ti, Ta, Mo, Nd, Ni, Co, Zr, Zn, Ru, Rh, Pd, Os, and Ir, an alloy material or a compound material, each of which is mainly containing these elements; or a lamination layer thereof. As a method for forming the metal film, a sputtering method using a target of a metal may be employed, for example. The metal film may be formed to have a thickness of from 10 to 200 nm, preferably, from 50 to 75 nm.

Instead of the metal film, a film of such a metal which is nitrided (for example, nitride tungsten or nitride molybdenum) can be used. Further, instead of the metal film, a film of an alloy of the above metals (for example, an alloy of W and Mo: $W_xMo_{1-x}$) may be used. In this instance, the film may be formed by a sputtering method using a plurality of targets such as a first metal (W) and a second metal (Mo) or using a target of an alloy of the first metal (W) and the second metal (Mo) in a film formation chamber. Further, nitrogen or oxygen may be added to the metal film. As a method for adding, for example, ion implantation for adding nitrogen or oxygen into the metal film may be used. Alternatively, the metal film may be formed in the atmosphere of nitrogen or oxygen in the film formation chamber by a sputtering method using a target of a nitride metal.

By forming the metal film, a separation step can be controlled. That is, in the case of using a metal alloy, it is possible to control the separation step by controlling the composition ratio of each metal in the alloy. Specifically, whether the heating treatment is required or not as well as the heating temperature for separation can be controlled. Accordingly, the margin of the process can be widened.

Thereafter, a separation layer 141 is formed over the metal film 140. The separation layer comprises an oxide film containing silicon, and the oxide film serves also as a base film. An insulating film containing nitrogen, such as a silicon nitride (SiN) film, a silicon nitride oxide (SiNO) film, or a silicon oxynitride (SiON) film, may be provided below the semiconductor film so as to prevent intrusion of impurities or dusts from the metal film or the substrate.

As an oxide film containing silicon, a silicon oxide film, a silicon oxynitride film, or the like may be formed by a sputtering method or a CVD method. The oxide film containing silicon is preferably formed to be at least about twice as thick as the metal film. In this embodiment mode, a silicon oxide film is formed by a sputtering method using a silicon target to be 150 to 200 nm thick.

When forming the oxide film containing silicon, an oxide having the metal (hereinafter, referred to as a metal oxide and not shown) is formed on the surface of the metal film 140. The thickness of the metal oxide may be 0.1 nm to 1 μm thick, preferably, 0.1 nm to 100 nm thick, further preferably, 0.1 nm to 5 nm thick. As the metal oxide, a thin metal oxide can be also used, which is formed on the surface by treating the metal oxide by a solution having sulfuric acid, hydrochloric acid, or nitric acid; a mixed solution in which hydrogen peroxide solution is mixed with sulfuric acid, hydrochloric acid, or nitric acid; or ozone water. As another method, a plasma treatment in the atmosphere of oxygen; or an oxidation treatment in the atmosphere containing oxygen with ozone generated by ultraviolet irradiation may be employed. Alternatively, the metal oxide can be formed by heating in a clean oven at temperatures approximately 200 to 350° C.

Then, a semiconductor film 103 or the like is formed on the separation layer 141 to complete a thin film transistor. After that, an insulating film 110 and a connection terminal portion 118 in which a wiring 112 connected to each impurity region, a conductive film 115, an insulating film 116 and a conductive film 117 are provided are formed. A method for forming the thin film transistor or the like may be referred to the above described embodiment mode.

The state that the metal film 140, the metal oxide, the separation layer 141 and the semiconductor film are stacked, namely, the semiconductor film is formed over one surface of the separation layer and the metal oxide and the metal film are formed over the other surface thereof is obtained.

After forming the thin film transistor as described above, at least after forming the metal oxide, a heat treatment is conducted to heat the metal oxide. Consequently, the metal oxide film becomes crystalline. For example, in the case of using tungsten (W) as the metal film, a metal oxide of $WO_2$ or $WO_3$ becomes crystalline by a heat treatment of 400° C. or more. Whether a heat treatment is conducted or not or the temperature may be determined depending on a metal film to be selected. Consequently, the metal oxide can be crystallized if necessary and separation can be performed easily.

Note that a heat treatment in manufacturing a semiconductor element can serve as the heat treatment for crystallization described above. For example, a heat treatment after forming a semiconductor film can serve as a heat treatment for dehydrogenating a semiconductor film, namely, dehydrogenation step. When a crystalline semiconductor film is formed, it can be heat-treated by a heating furnace or laser light irradiation. Consequently, manufacturing steps can be reduced.

Figure 5B:
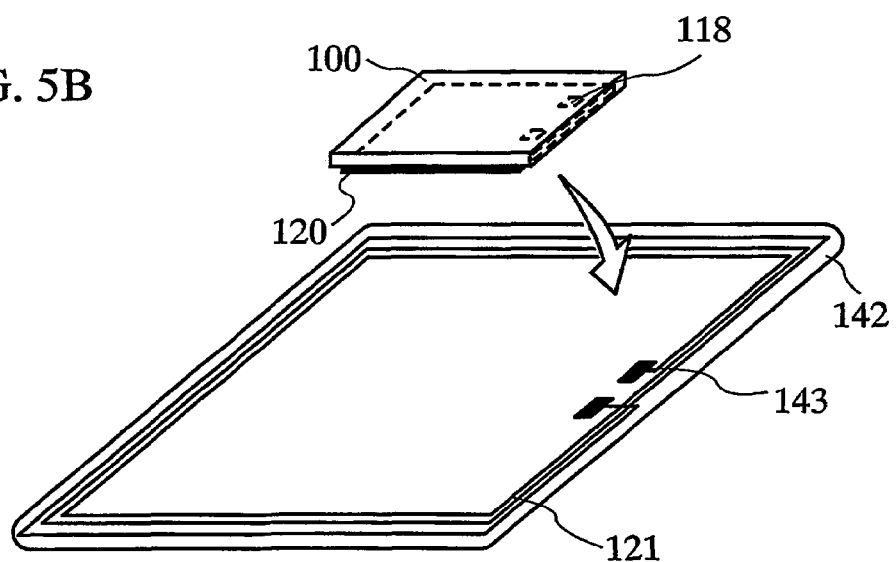

Then, as shown in FIG. 5B, a thin film integrated circuit 120 formed over the substrate is attached directly on a surface of a product. Note that product may have a curved surface like a side face of a bottle. In this embodiment mode, the thin film integrated circuit is attached to a substrate 142 in which an antenna 121 and a connection terminal portion 143 are provided. At this time, the thin film integrated circuit and the substrate are attached so as to connect a connection terminal portion 118 of the integrated circuit with the connection terminal portion 143 over the substrate by an adhesive agent. As the adhesive agent, ultraviolet curing resin, specifically, an adhesive agent such as epoxy resin type adhesive agent or resin additive, a two-sided tape or the like can be used.

Figure 5C:
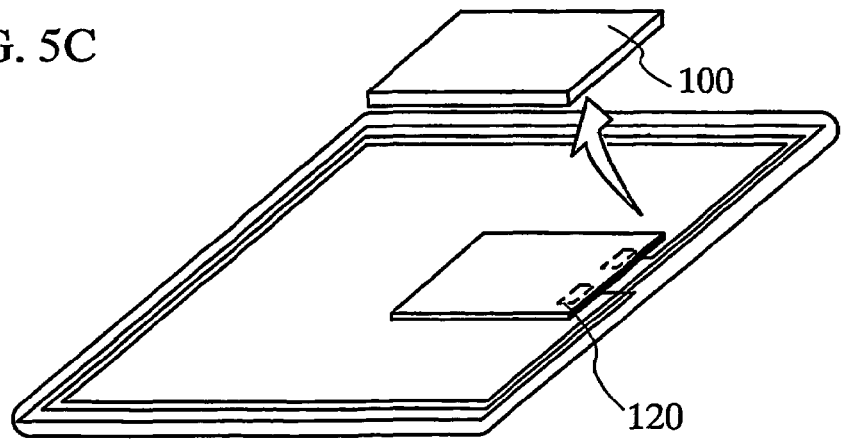

As shown in FIG. 5C, the substrate 100 is separated by a physical means. At this time, the substrate is separated inside the crystallized metal oxide, or in opposite surfaces of the metal oxide, namely at the interface between the metal oxide and the metal film or the interface between the metal oxide and the separation layer.

In order to facilitate the separation, a part of the substrate is severed. Then, the vicinity of the separation interface over the severed surface, namely at the interface of the metal film and the metal oxide may be scratched by a cutter or the like. Alternatively, the separation layer in the region where the semiconductor element is not provided may be scratched.

After the substrate 100 is separated, the metal oxide is entirely removed on the side of the thin film integrated circuit. Alternatively, a part of or most parts of the metal oxide is dotted (remains) over the thin film integrated circuit. In this instance, the remaining metal oxide may be removed by etching or the like. Further, the oxide film containing silicon may be also removed.

As described above, a product in which a thin film integrated circuit is mounted can be manufactured.

This embodiment mode describes a case that a thin film integrated circuit is mounted in a so-called face-down state that a conductive film of a connection terminal portion exists downside. However, a thin film integrated circuit may be mounted in a face-up state that a conductive film of a connection terminal portion exists upside. In this case, a wire-boding method may be employed for contacting a conductive film of the connection terminal portion of the integrated circuit with an antenna or the like.

A mode that a thin film transistor is formed over the substrate 100, is transferred, and then is separated from the substrate 100 has been described above. However, an object for transferring or timing or number of times of separating is not limited to that of the above embodiment mode. For example, a synthetic resin substrate having flexibility may be used as the object for transferring, a thin film transistor may be completed after transferring to the synthetic resin substrate. In particular, in the case of forming a thin film transistor having a non-crystalline semiconductor film as shown in Embodiment Mode 2, the thin film transistor can be completed after transferring an active layer of the thin film transistor to the synthetic resin substrate. This is because the thin film transistor having a non-crystalline semiconductor film can be formed at a low heating-temperature or without conducting a heat treatment. Thereafter, the thin film transistor may be transferred to a printed wiring board or the like. A thin film integrated circuit that is formed through steps of transferring and separating can be mounted over a product in a face-up state or face-down state.

In the case of separating, a peelable adhesive agent for attaching a substrate to be separated is used. For example, a peelable adhesive agent such as a ultraviolet peelable type that is removed by ultraviolet rays, a heat peelable type that is removed by heat, a water-soluble adhesive agent that is removed by water; or a two-sided tape may preferably be employed. Ultraviolet rays irradiation, heating or water-washing may be conducted to remove the adhesive agent.

This embodiment mode describes a separation method using a metal film or the like, but the substrate 100 may be separated by another separation method. For example, it is possible that the separation layer is irradiated with laser light to separate the substrate 100, or the substrate 100 is etched to remove for separating the substrate 100. The separation layer can be cut in to be separated by a fluorine based or chlorine based etchant such as $ClF_3$.

EMBODIMENT MODE 4

A method for manufacturing an antenna of an ID chip is described in Embodiment Mode 4.

A thin film integrated circuit and an antenna are necessary for the function of a non-contact type ID chip as described above. The antenna can be arranged variedly, and a connection terminal for connecting with a thin film integrated circuit is provided at least at an edge of the antenna.

Figure 6A:
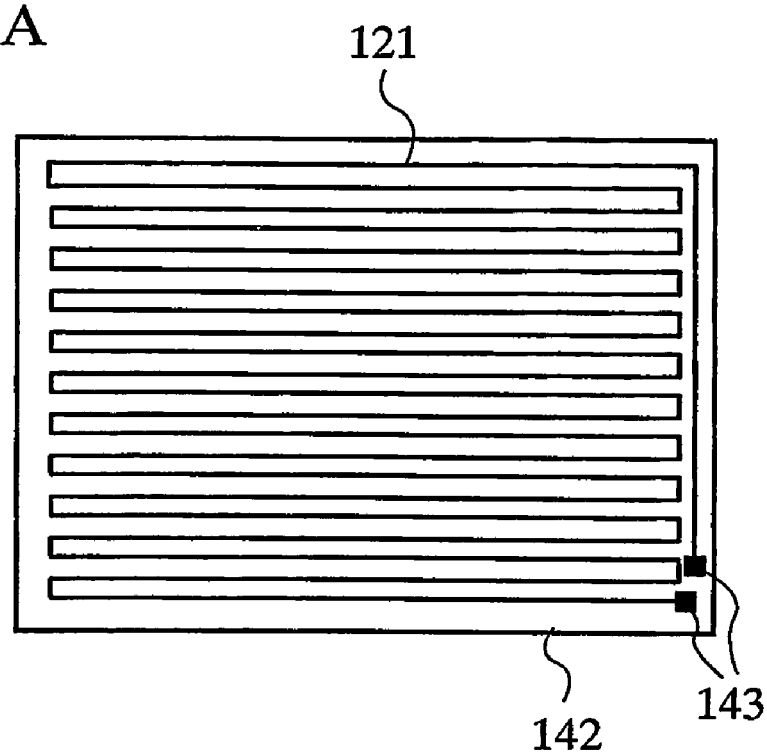
FIGS. 6A and 6B are each a top view of an antenna.

For example, as shown in FIG. 6A, an antenna formed over a substrate 142 is provided to be serpentine in a rectangular shape, and a connection terminal 143 is provided for each edge. The connection terminals are provided adjacent to each other in FIG. 6A, but the arrangement is not limited thereto. The arrangement of the respective connection terminals can be determined according to connection terminals of the thin film integrated circuit.

Figure 6B:
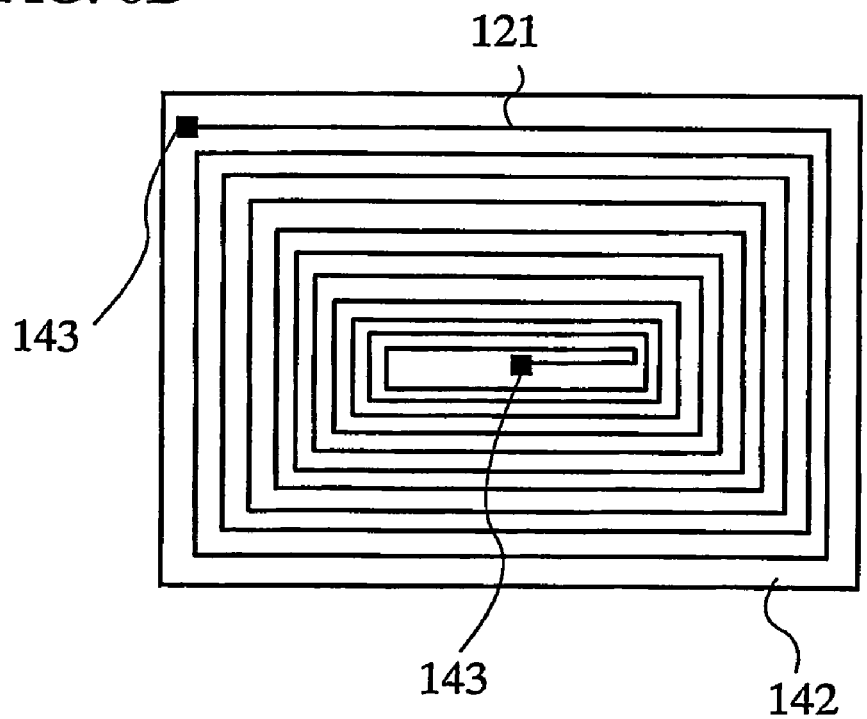

The antenna may be provided to be winded as shown in FIG. 6B. The connection terminal 143 is provided at the edge of the antenna. In FIG. 6B, the connection terminals are provided apart from each other, but may be provided adjacent to each other as shown in FIG. 6A.

The antenna may be arranged circularly instead of being arranged in a rectangular shape.

Then, a method of forming the antenna is described.

Figure 7A:
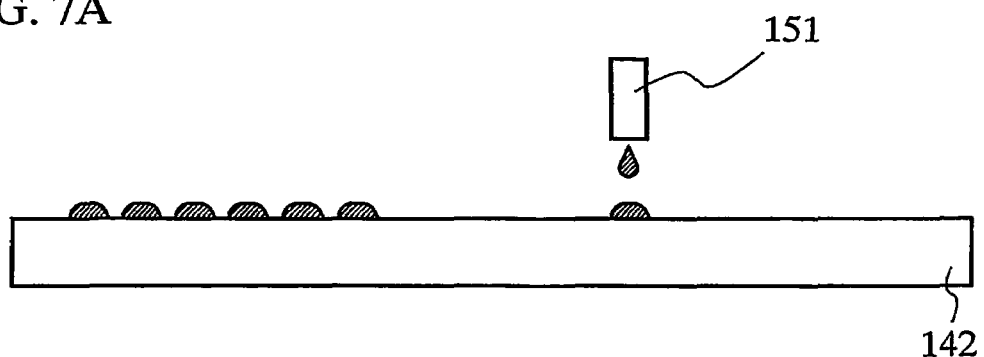
FIGS. 7A to 7C are each a cross-sectional view showing manufacturing steps of an antenna.

As shown in FIG. 7A, the antenna is formed to be arranged in a predetermined portion over the substrate 142. A conductive material such as Ag (silver), Al (aluminum), Au (gold), Cu (copper) or Pt (platinum) can be used as a material of the antenna. In the case of using comparatively highly resistant Al or Au, a wiring resistance is of concern. However, the antenna is made thicker or the width of the antenna is made large when an area of forming the antenna is large, thereby reducing the wiring resistance. In the case of using a conductive material having a risk of dispersing, e.g., Cu, an insulating film serving as a protective film may be formed to cover a surface to be provided with the antenna or to cover the periphery of Cu. In addition, the antenna can be formed by a sputtering method, a droplet discharging method, a printing method, a plating method, a photolithography method or a vapor deposition method using a metal mask. Specifically, when the antenna is formed by a droplet discharging method, a printing method or a plating method, the number of manufacturing steps can be reduced because it is not necessary to pattern a conductive film. In this embodiment mode, the antenna is formed by a droplet discharging method for discharging droplets having Ag from a nozzle 151. At the time, a base film including TiOx or the like may be formed to enhance adhesiveness of Ag.

When it is necessary to remove a solvent in the droplets after discharging the droplets, a heat treatment for baking or drying is conducted. The heat treatment may be referred to the manufacturing method of the gate electrode in the above described embodiment. The organic solvent including metal fine particles is ejected by the droplet discharging method and is cured by heat treatment or light irradiation. The metal fine particles contact with each other by volume shrinkage due to the curing of organic solvent, thereby welding and fusing, or agglomeration is promoted, and a conductive layer is formed. The conductive layer formed by sputtering method includes a columnar structure, while the conductive layer formed by the droplet discharging method includes a polycrystalline having a plurality of grain boundaries. Note that, the wiring formed like this includes fine particles having average particle diameter 1 to 50 nm, more preferably 3 to 7 nm.

Figure 7B:
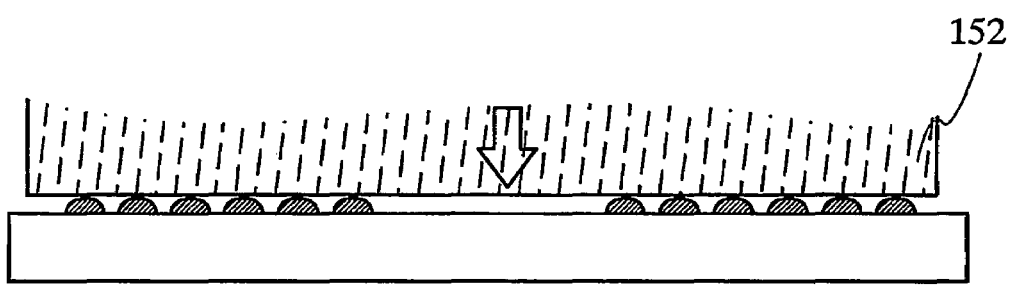

Further preferably, the droplets may be pressed as shown in FIG. 7B. Consequently, the antenna can be made thinner, and further, the planarity of the antenna surface can be enhanced. In addition to a pressurizing unit 152, a heating unit may be provided to perform the heat treatment at the same time.

Figure 7C:
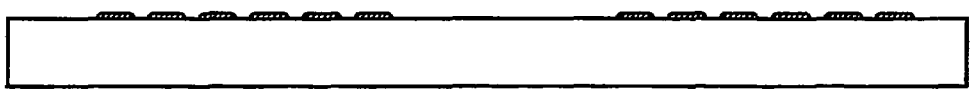

As shown in FIG. 7C, the substrate on which the antenna is formed (hereinafter, referred to as an antenna substrate) can be completed. In addition, an insulating film serving as a protective film may be formed to cover the antenna.

Figure 8A:
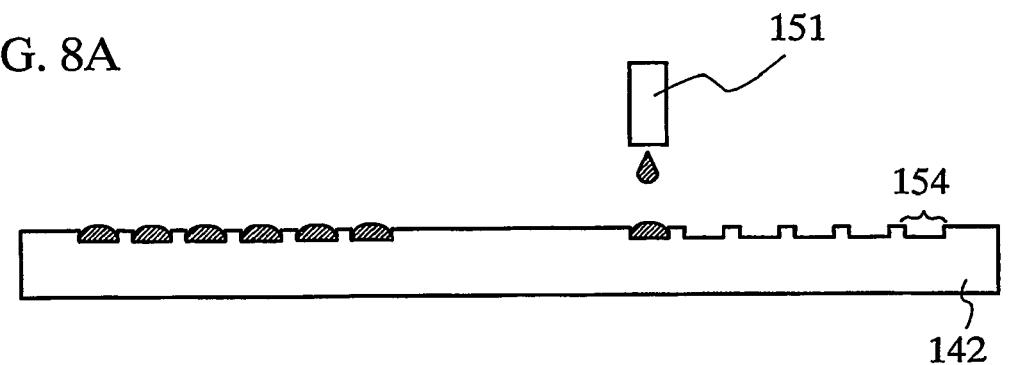
FIGS. 8A to 8C are each a cross-sectional view showing manufacturing steps of an antenna.

An opening portion 154 is formed in the substrate 142 as shown in FIG. 8A, and an antenna may be formed in the opening portion. Similarly to FIG. 7A, the antenna is formed by a droplet discharging method for discharging droplets containing Ag from a nozzle 151. Other materials or manufacturing method of the antenna can be referred to the description about FIG. 7A.

Figure 8B:
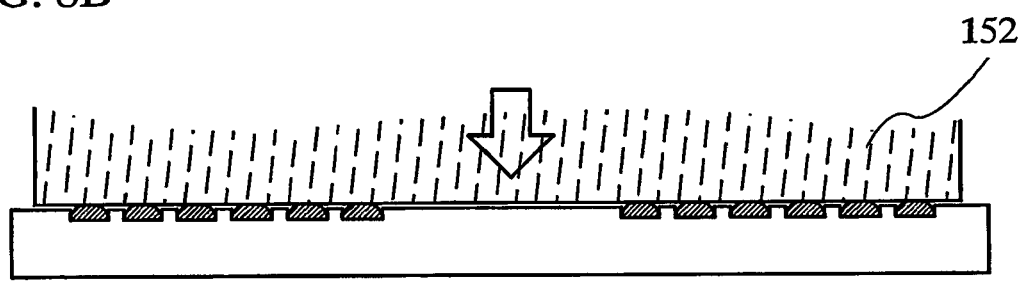

As shown in FIG. 8B, the antenna is preferably pressed by a pressurizing unit 152 similarly to FIG. 7B. In addition to the pressurizing unit 152, a heating unit may be provided to perform the heat treatment at the same time.

As shown in FIG. 8 C, the antenna substrate can be completed. In addition, an insulating film serving as a protective film may be formed to cover the antenna.

Figure 8C:

In FIGS. 8A to 8C, the antenna can be formed in the opening portion, thereby achieving thinning of the antenna substrate.

EMBODIMENT MODE 5

Embodiment Mode 5 describes a specific method of mounting a thin film integrated circuit over an antenna substrate.

Figure 9:
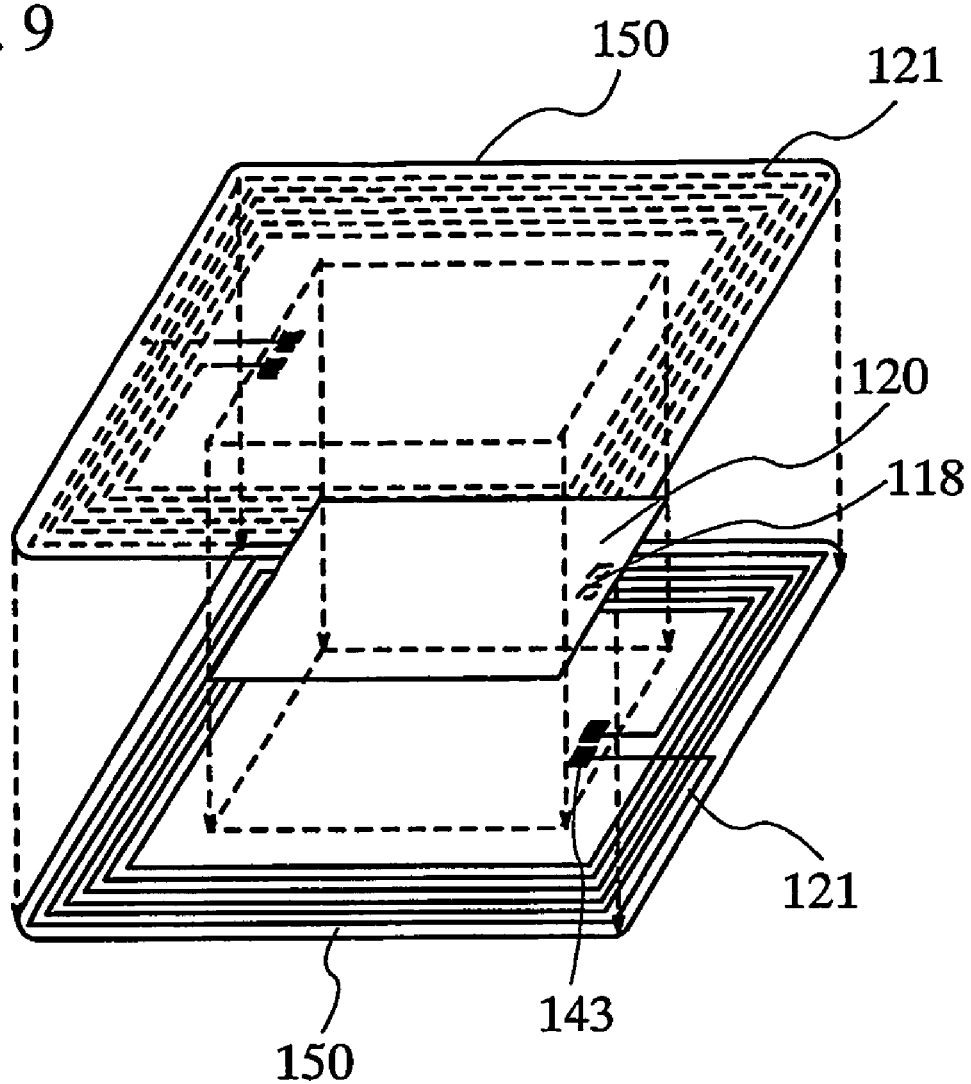
FIG. 9 shows a mode in which a thin film integrated circuit is mounted.

The thin film integrated circuit formed according to the above embodiment mode is mounted over the antenna substrate formed according to the above embodiment mode. As shown in FIG. 9, a pair of antenna substrates 150 in which antennas 121 are formed is prepared. A thin film integrated circuit 120 is provided between the pair of antenna substrates, in other words, the pair of antenna substrates are arranged with the thin film integrated circuit interposed therebetween. Note that, the pair of antenna may be arranged symmetrically with the thin film integrated circuit interposed therebetween. After that, they are fixed so that connection terminal portions 118 and 143 are connected to each other. A wire bonding method may be employed for connecting them. Thus, an ID chip is completed.

Next, a method for forming plural chips by using one substrate (multiple-pattern), that is, the method by which a plurality of ID chips are formed from a large substrate by a mounting method shown in FIG. 9 is described.

Figure 14A:
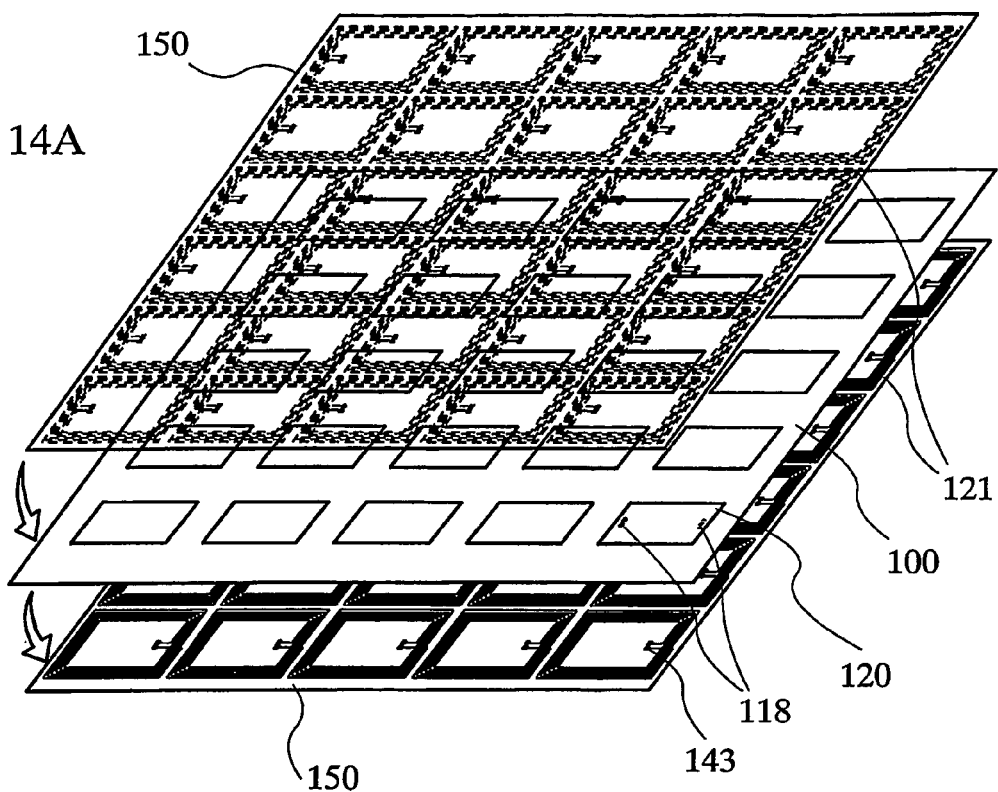
FIGS. 14A and 14B each show manufacturing steps of a thin film integrated circuit.

As shown in FIG. 14A, a plurality of thin film integrated circuits 120 (25 pieces e.g.) are formed over a large substrate 100. The large substrate 100 is arranged between antenna substrates 150, and they are fixed so that a connection terminal portion 118 of each thin film integrated circuit and a connection terminal portion 143 of each antenna are connected.

Figure 14B:
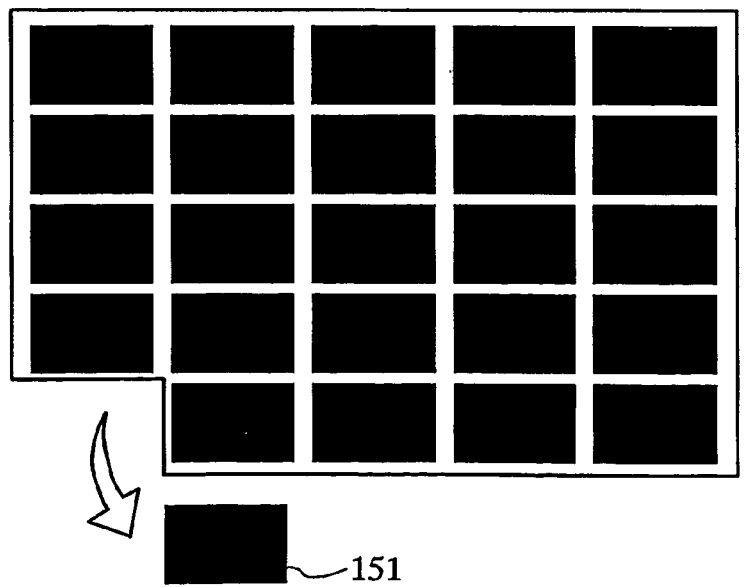

As shown in FIG. 14B, plural ID chips are formed over the large substrate and they are separated by scribing or dicing to complete one ID chip 151. A laser may be used for cutting apart ID chips. It is thought that in the case of cutting out an ID chip in particular, the ID chip is less damaged from the cutting than a chip formed over a silicon wafer. Thus, a margin for cutting out an ID chip can be made smaller than a margin for cutting out a chip formed over a silicon wafer. Thus, an area for forming an antenna can be increased. Thereafter, the ID chip may be covered with an insulating film serving as a seating film In this way, a cost of an ID chip can be reduced by obtaining plural ID chips from a large substrate. The integrated circuit whose unit price is very low, such as a chip, can produce great profits by reducing the cost.

Figure 10A:
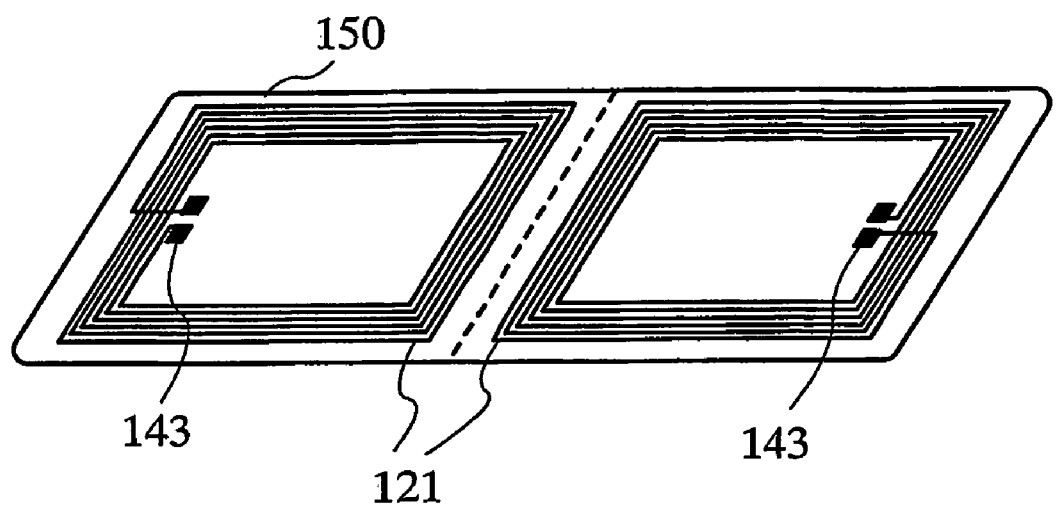
FIGS. 10A and 10B each show a mode in which a thin film integrated circuit is mounted.
Figure 10B:
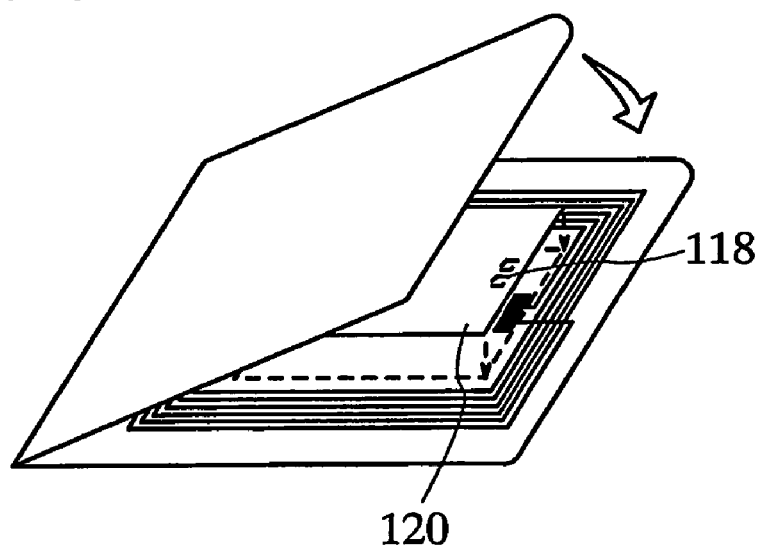

A method of mounting a thin film integrated circuit by a method different from the method shown in FIG. 9, is shown in FIGS. 10A and 10B.

As shown in FIG. 10A, an antenna substrate 150 provided with a pair of antennas is prepared. As the antenna substrate, a flexible substrate that can be folded in half, for example, a flexible substrate such as polyethylene terephthalate (PET), a vinylidene chloride, polyvinyl chloride resin, is used.

After that, the antenna substrate is folded to sandwich the thin film integrated circuit 120 therein as shown in FIG. 10B after that. The crease of the antenna substrate may be cut in or provided with a concave portion for folding the antenna substrate easily. After that, they are fixed so that connection terminal portions 118 and 143 are connected to each other. A wire bonding method may be employed for connecting them. Thus, an ID chip is completed.

A pair of antennas is provided. Thus, it is possible that one antenna thereof is used for a power generation circuit and the other is used for a modulation circuit. Consequently, an antenna can be provided for each circuit and the communication range or sensitivity can be increased. In addition, opposite sides (a top face and a bottom face) of a thin film integrated circuit are each required to be provided with a connection terminal portion 118 so as to be connected to the pair of antennas.

It is necessary to provide an insulating film serving as a protective film so that each antenna does not short-circuit. In addition, a conductive resin may be applied between connection terminal portions and an insulating resin may be applied to a region except the region in which the conductive resin is applied.

In addition, a contact is formed in the antenna substrate and a connection terminal portion of the antenna is formed on the back face (the face which is not provided with an antenna) of the antenna substrate, thereby obtaining a structure in which each antenna does not short-circuit.

This embodiment mode describes the case that the thin film integrated circuit is mounted between the pair of antenna substrates. Alternatively, a thin film integrated circuit may be mounted over one antenna substrate. In this embodiment mode, the antenna is not arranged over the thin film integrated circuit, but an antenna may be arranged over the thin film integrated circuit with an insulating film interposed therebetween.

In the mounting mode in FIGS. 10A and 10B, plural thin film integrated circuits formed by using a large substrate, and plural antenna substrates are formed from a large substrate, thereby reducing the cost of an ID chip.

Next, a mode of a functional configuration of an ID chip is described with reference to FIG. 15.

Reference numeral 400 denotes an antenna and reference 401 denotes a thin film integrated circuit. The antenna 400 includes an antenna coil 402 and a capacitor element 403 formed in the antenna coil 402. The thin film integrated circuit 401 comprises a demodulation circuit 409, a modulation circuit 404, a rectification circuit 405, a microprocessor 406, a memory 407 and a switch 408 for applying a load to the antenna 400. Note that plural memories 407 may be used without being limited to one.

A signal transmitted from a reader/writer as electric waves is converted into an AC electrical signal by electromagnetic induction in the antenna coil 402. The AC electrical signal is demodulated in the demodulation circuit 409 and transmitted to the microprocessor 406 in the subsequent stage. Further, a power source voltage is generated by the AC electrical signal in the rectification circuit 405, and supplied to the microprocessor 406 in the subsequent stage.

In the microprocessor 406, various types of processing are performed in accordance with inputted signals. The memory 407 can be used not only for storing program, data and the like used in the microprocessor 406 but also as a work area in processing. A signal transmitted from the microprocessor 406 to the modulation circuit 404 is modulated into an AC electrical signal. The switch 408 can apply a load to the antenna coil 402 in accordance with the AC electrical signal from the modulation circuit 404. The reader/writer receives the load applied to the antenna coil 402 by electric waves, thereby reading a signal from the microprocessor 406 effectively.

Figure 15:
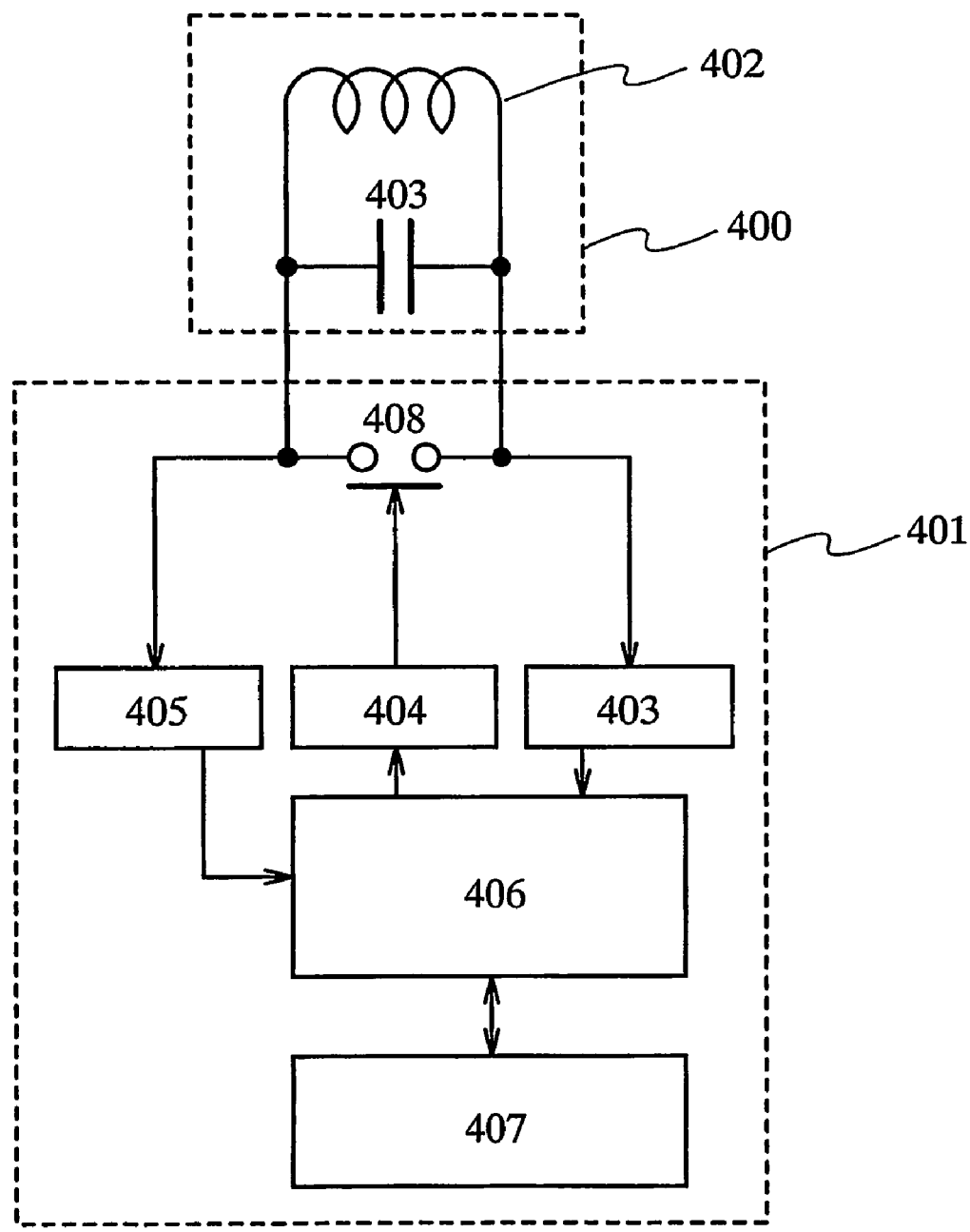
FIG. 15 shows a functional configuration of an ID chip.

The aforementioned configuration of the ID chip shown in FIG. 15 is just an example and the present invention is not limited to this. A method of transmitting signals is not limited to the electromagnetic induction method as shown in FIG. 15, and an electromagnetic coupling method, a microwave method and other transmitting methods may also be adopted. Further, an ID chip of the present invention may include a function such as GPS.

EMBODIMENT MODE 6

Embodiment Mode 6 describes a product on which an ID chip is mounted.

Figure 11A:
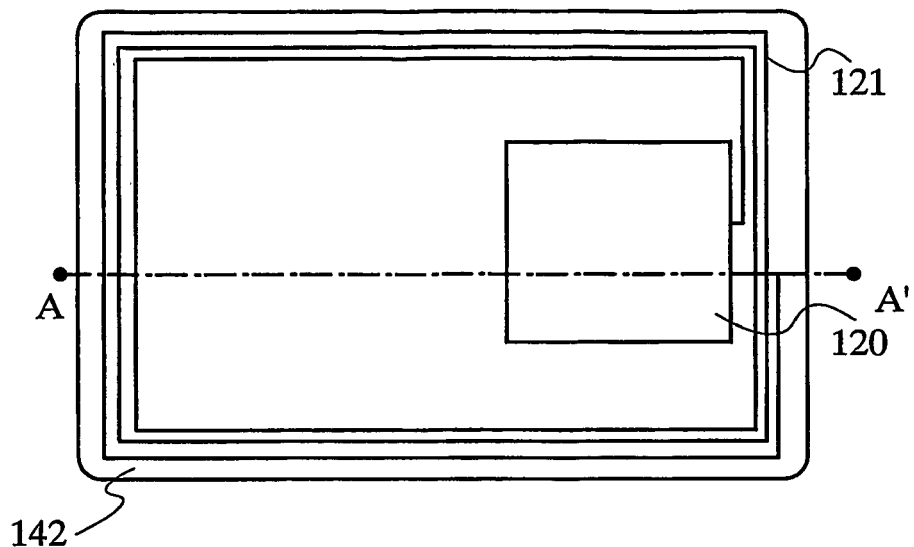
FIGS. 11A to 11C each show a card in which a thin film integrated circuit is mounted.

When an antenna substrate is a printed board for cards, the substrate can be used as a card in which an ID chip is mounted (hereinafter, referred to as ID card). A top view of the ID card including an ID chip is shown in FIG. 11A. An antenna 121 provided in an inner periphery of the card and a thin film integrated circuit 120 connected to the antenna are mounted in the ID card.

Figure 11B:
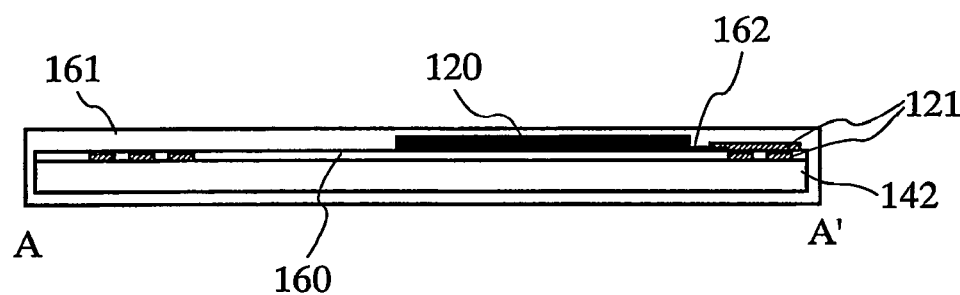

A cross-sectional view taken along A-A' of FIG. 11A is shown in FIG. 11B. An insulating film 160 is formed over an antenna as a protective film and a thin film integrated circuit is mounted over the insulating film in this embodiment mode, although the thin film integrated circuit and the antenna may be provided in the same layer. Thus, in the case where an antenna provided in an inner periphery of the card is connected to a thin film integrated circuit, an antenna (referred to as lead wire) is formed over the insulating film so as not to short-circuit with another antenna and the lead wire can be connected to the thin film integrated circuit. The thin film integrated circuit 120 is connected to the antenna 121 through the connection terminal portion. In this embodiment mode, the thin film integrated circuit in a face-down state is connected to the antenna. Each connection terminal portions is connected through a connecting wiring 162. Alternatively, each connection terminal portion may be connected to each other by using a conductive resin.

After that, a film 161 serving as a protective film is formed by a sealing method or a printing method. A pattern (design) of an ID card may be printed over the film.

Figure 11C:
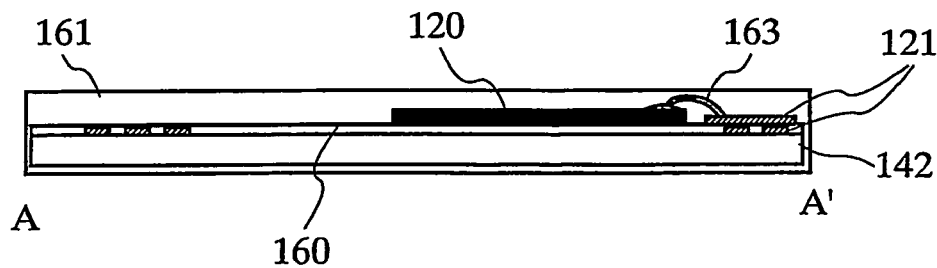

A mode in which a thin film integrated circuit is connected to an antenna by a method different from that of FIG. 11B is shown in FIG. 11C. The thin film integrated circuit shown in FIG. 11C has a feature of being connected with a wire 163 by a wire bonding method, since it is provided in a face-up state. Other structures are similar to those of FIG. 11B, and thus, the description is omitted.

The thin film integrated circuit and the antenna may be connected as in the above embodiment mode.

As described above, an ID card can be completed.

In addition, the ID chip can be used as a tag (hereinafter, referred to as an ID tag)to be used as a management means of a product or merchandise. For example, as shown in FIG. 12A, bar codes 171 including an ID chip is attached to a product 170, and is used as an ID tag.

Figure 12A:
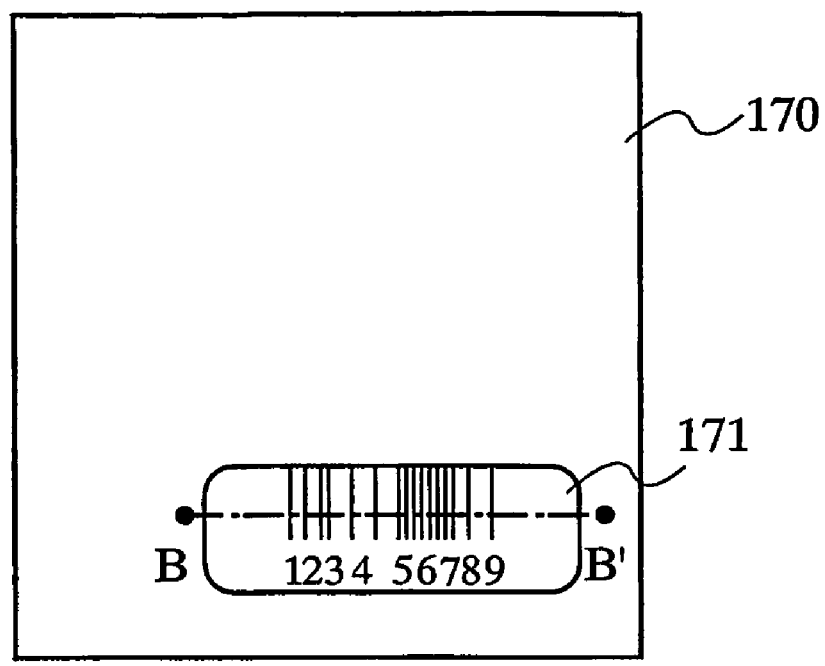
FIGS. 12A and 12B each show a thin film integrated circuit attached on a product.
Figure 12B:
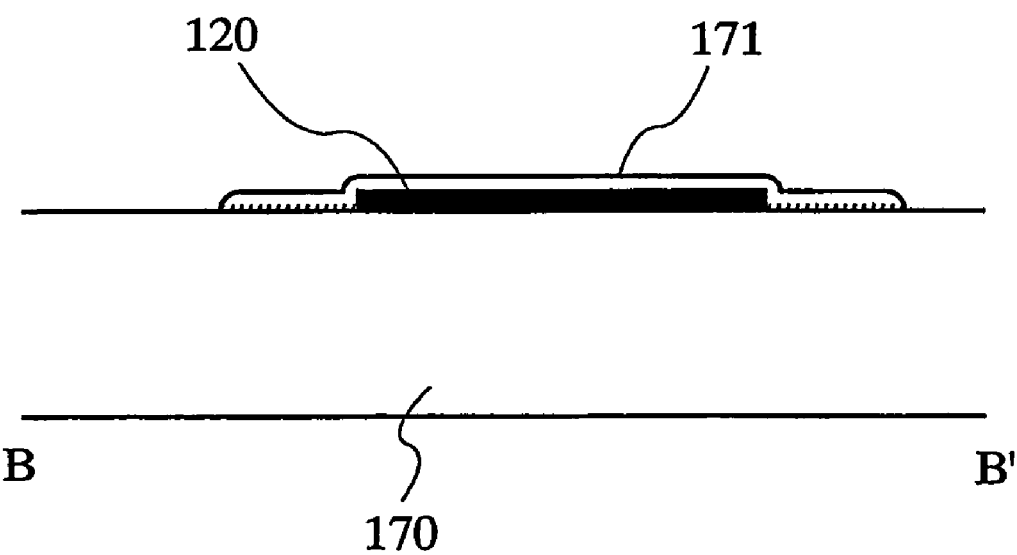

A cross-sectional view taken along B-B' of FIG. 12A is shown in FIG. 12B. An ID chip having the thin film integrated circuit 120 is attached to the product 170 together with the bar codes 171.

Next, a case where an ID chip is attached to a product bottle together with a label is shown.

Figure 13A:
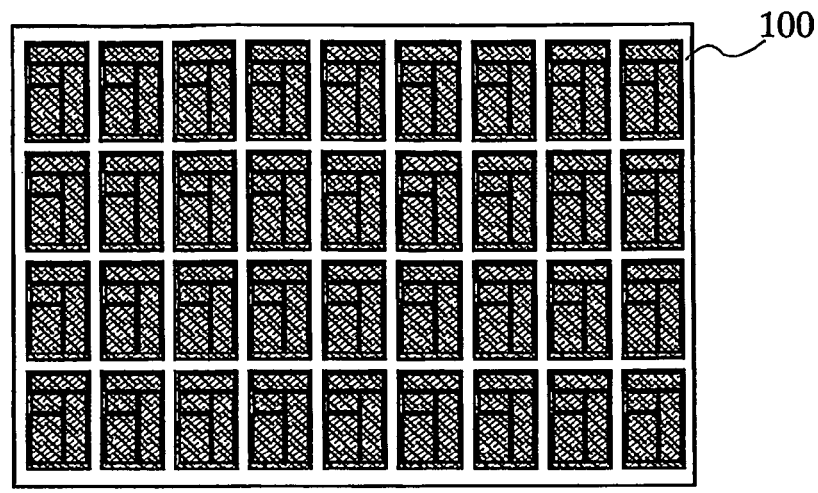
FIGS. 13A to 13C each show management of a product on which a thin film integrated circuit is attached.
Figure 13B:
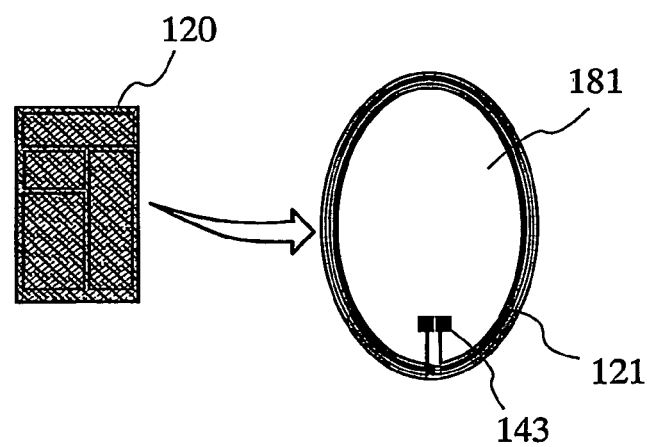

In FIG. 13A, plural thin film integrated circuits 120 are formed over a large substrate 100. After that, as shown in FIG. 13B, one thin film integrated circuit 120 is cut out and mounted over a label 181 in which an antenna 121 is formed. At the time, the thin film integrated circuit and the antenna are fixed so that a connection terminal portion of a thin film integrated circuit and a connection terminal portion 143 of an antenna are connected. Note that a method for forming the antenna over a label may employ a separation method shown in Embodiment Mode 3. Specifically, a separation layer and an antenna are formed over a glass substrate, transferred to a label, and the glass substrate is separated therefrom. According to the separation method of the present invention, an antenna can be transferred onto e.g., a label, which has an insulating surface having no heat-resistance. Alternatively, according to Embodiment Mode 3, an ID chip in which an antenna is formed integrally may be transferred onto a label. Note that a method for manufacturing an antenna may be referred to the above embodiment mode 4.

Figure 13C:
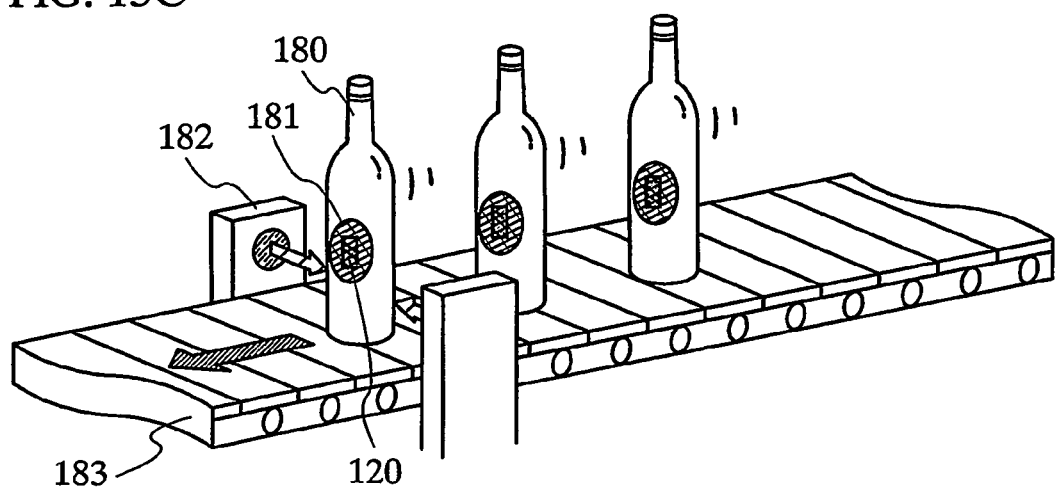

As shown in FIG. 13C, the thin film integrated circuit and the antenna, that is, an ID chip, are attached onto a surface of a bottle 180 having a curved surface together with a label 181.

Such products are put on a belt conveyor 183 or the like and passes near a reader device 182. At this time, information can be read out by the reader device 182. Information can be written into an ID tag or information stored in the ID tag can be renewed by providing a writer device as well as the reader device.

Further, the ID chip can make it possible to manage information with no contacts, and thus, the information management can be conducted by a reader or writer device even when products are packed in a cardboard or the like.

The distributing of products equipped with an ID chip is automated as described above, thereby reducing personnel costs needed for distributing products. Human errors can be eliminated.

For examples of the products, eatables and drinkables, clothing, books and the like can be given. An ID tag can be attached to rental goods, thereby simplifying product management.

Because an ID chip of the present invention is very thin, it is provided in valuable securities such as a bill so as to prevent the misuse thereof or the like, or simplifying the management. When an ID chip is included in valuable securities, it may be mounted in the interior of the valuable securities to prevent falsification or the like.

Information of an ID chip mounted in or attached onto a product as described above has a wide variety, e.g., allergy, main components, advertising etc., in addition to basic information on places, personals, dates etc., of production or manufacturing. In addition, as shown in FIGS. 12A and 12B, when it is used together with bar codes, the information which is not required to be rewritten, e.g. basic information as above, may be input in the bar codes and information which can be rewritten may be input into an ID chip.

As for the reader device to read the information like this, a portable electronic device such as a cellular phone may be provided with a reader function, besides a dedicated reader device. In the case of using a cellular phone, information of an ID chip can be provided by voice or display on a screen.

Other products including an ID chip include a cellular phone, a watch, a bicycle and the like. For example, by mounting an ID chip in a portable electronic device such as a cellular phone, it can have an accounting function like a credit card. A product with an ID chip such as watch that is used by a lot of consumers at any age and that can be worn easily can make it possible to grasp the location when a child is lost or in another situation. When a child brings a product having an ID chip with itself, the parents can grasp the present location of the child. Similarly, an ID chip is installed in a pet collar or the like, thereby grasping the present location of the pet. In addition, when an ID chip is provided for products that are often stolen such as a bicycle, an effect of prevention of theft can be obtained, since the present location of the product can be grasped. In this way, when a product including an ID chip is stolen, the present location thereof can be grasped.

The invention claimed is:

1. A method for manufacturing a semiconductor device comprising the steps of:
    forming a thin film integrated circuit by a droplet discharging method or a printing method over a first substrate in at least one step;
    forming an antenna over a second substrate;
    attaching the first substrate to the second substrate so that the thin film integrated circuit is electrically connected to the antenna; and
    after attaching the first substrate to the second substrate, separating the first substrate from the thin film integrated circuit.

2. The method for manufacturing a semiconductor device according to claim 1, wherein the antenna is formed by a sputtering method, a droplet discharging method, a printing method, a plating method, a photolithography method, or a vapor deposition method, using a metal mask.

3. The method for manufacturing a semiconductor device according to claim 1, wherein the antenna is formed by a sputtering method, a droplet discharging method, a printing method, a plating method, a photolithography method, or a vapor deposition method using a metal mask, and the antenna is pressed.

4. The method for manufacturing a semiconductor device according to claim 1, the method further comprising the steps of:
    forming a metal film and an oxide film containing silicon over the metal film, between the first substrate and the thin film integrated circuit;
    forming a metal oxide film comprising a metal included in the metal film on a surface of the metal film; and
    separating the first substrate at an interface between the oxide and the metal film or an interface between the metal oxide film and the oxide film containing silicon.

5. The method for manufacturing a semiconductor device according to claim 1, wherein the thin film integrated circuit includes a thin film transistor comprising a silicon semiconductor film.

6. A method for manufacturing a semiconductor device comprising the steps of:
    forming a thin film integrated circuit over a first substrate, the thin film integrated circuit comprising the steps of:
    forming a semiconductor film over the first substrate;
    forming a gate insulating film over the semiconductor film; and
    forming a gate electrode by a droplet discharging method or a printing method over the gate insulating film;
    forming an antenna over a second substrate;
    attaching the first substrate to the second substrate so that the thin film integrated circuit is electrically connected to the antenna; and
    after attaching the first substrate to the second substrate, separating the first substrate from the thin film integrated circuit.

7. The method for manufacturing a semiconductor device according to claim 6, wherein the antenna is formed by a sputtering method, a droplet discharging method, a printing method, a plating method, a photolithography method, or a vapor deposition method, using a metal mask.

8. The method for manufacturing a semiconductor device according to claim 6, wherein the antenna is formed by a sputtering method, a droplet discharging method, a printing method, a plating method, a photolithography method, or a vapor deposition method using a metal mask, and the antenna is pressed.

9. The method for manufacturing a semiconductor device according to claim 6, the method further comprising the steps of:
    forming a metal film and an oxide film containing silicon over the metal film, between the first substrate and the thin film integrated circuit;
    forming a metal oxide film comprising a metal included in the metal film on a surface of the metal film; and
    separating the first substrate at an interface between the oxide film and the metal film or an interface between the metal oxide film and the oxide film containing silicon.

10. The method for manufacturing a semiconductor device according to claim 6, wherein the thin film integrated circuit includes a thin film transistor comprising a silicon semiconductor film.

* * * * *